US012660387B2

(12) United States Patent
Xie et al.

(10) Patent No.: US 12,660,387 B2
(45) Date of Patent: Jun. 16, 2026

(54) DISPLAY PANEL INCLUDING LIGHT-SHIELDING LAYER AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Taofeng Xie, Beijing (CN); Yuanjie Xu, Beijing (CN); Shuang Li, Beijing (CN); Yao Huang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 407 days.

(21) Appl. No.: 18/255,312

(22) PCT Filed: Apr. 27, 2022

(86) PCT No.: PCT/CN2022/089643
§ 371 (c)(1),
(2) Date: May 31, 2023

(87) PCT Pub. No.: WO2023/206160
PCT Pub. Date: Nov. 2, 2023

(65) Prior Publication Data
US 2024/0355973 A1 Oct. 24, 2024

(51) Int. Cl.
*H10H 20/855* (2025.01)
*H10H 20/857* (2025.01)
(Continued)

(52) U.S. Cl.
CPC ........ *H10H 20/855* (2025.01); *H10H 20/857* (2025.01); *H10D 86/441* (2025.01); *H10D 86/60* (2025.01); *H10W 90/00* (2026.01)

(58) Field of Classification Search
CPC .. H10H 20/855; H10H 20/857; H10D 86/441; H10D 86/60; H10W 90/00; H01L 25/0753; H01L 25/167
See application file for complete search history.

(56) References Cited

U.S. PATENT DOCUMENTS 11,444,121 B2 * 9/2022 Herner ................. H10H 29/142
11,785,799 B2 * 10/2023 Kang ................... H10K 59/121
257/40
(Continued)

FOREIGN PATENT DOCUMENTS

CN 110189639 A 8/2019
CN 112289809 A 1/2021
(Continued)

*Primary Examiner* — Tan N Tran
(74) *Attorney, Agent, or Firm* — XSENSUS LLP

(57) ABSTRACT
A display panel has a display region, the display region includes a main display region and a secondary display region, and the main display region surrounds at least part of the secondary display region. The display panel includes: a base substrate at least located in the display region; a pixel circuit layer located on a side of the base substrate and at least located in the display region, the pixel circuit layer including a plurality of surrounding pixel circuits, the plurality of surrounding pixel circuits being located in the main display region and at least partially surrounding the secondary display region; and a light-shielding layer located in the main display region and between the base substrate and the pixel circuit layer, an orthographic projection of the light-shielding layer on the base substrate at least partially overlapping an orthographic projection of the plurality of surrounding pixel circuits on the base substrate.

16 Claims, 26 Drawing Sheets

(51) Int. Cl.

| | | |
|---|---|---|
| *H10D 86/40* | (2025.01) | |
| *H10D 86/60* | (2025.01) | |
| *H10W 90/00* | (2026.01) | |

(56) References Cited

U.S. PATENT DOCUMENTS

| | | | | |
|---|---|---|---|---|
| 11,839,117 B2 * | 12/2023 | Ebisuno | ............... | H10K 59/131 |
| 12,238,982 B2 * | 2/2025 | Sung | ..................... | H10K 59/126 |
| 12,396,324 B2 * | 8/2025 | Lee | ..................... | H10K 59/1213 |
| 2021/0327958 A1 | 10/2021 | Li et al. | | |
| 2021/0408194 A1 * | 12/2021 | Zhang | .................. | H10K 59/126 |
| 2022/0067340 A1 | 3/2022 | Han et al. | | |
| 2023/0125368 A1 | 4/2023 | Dou et al. | | |

FOREIGN PATENT DOCUMENTS

| | | | |
|---|---|---|---|
| CN | 113421886 A | 9/2021 |
| CN | 114005859 A | 2/2022 |
| CN | 114156282 A | 3/2022 |

* cited by examiner

1000

100

Gate1

Gate2

ILD

SD1

PLN1

SD2

PLN2

Y

X

AND

Y

X

DISPLAY PANEL INCLUDING LIGHT-SHIELDING LAYER AND DISPLAY APPARATUS

CROSS-REFERENCE TO RELATED APPLICATION

This application is a national phase entry under 35 USC 371 of International Patent Application No. PCT/CN2022/089643, filed on Apr. 27, 2022, which is incorporated herein by reference in its entirety.

TECHNICAL FIELD

The present disclosure relates to the field of display technologies, and in particular, to a display panel and a display apparatus.

BACKGROUND

With the continuous development of science and technology, users have an increasing pursuit of the screen-to-body ratio (a ratio of an area of the display screen to an area of a front panel of the display apparatus) of the display apparatus.

In the field of display technologies, the concept of full screen has emerged, that is, optical devices such as cameras in the display apparatus are arranged under the display screen, so as to increase the ratio of the area of the display screen to the area of the front panel of the display apparatus, and make the ratio close to 100%.

SUMMARY

In an aspect, a display panel is provided. The display panel has a display region, the display region includes a main display region and a secondary display region, and the main display region surrounds at least part of the secondary display region. The display panel includes: a base substrate at least located in the display region; a pixel circuit layer located on a side of the base substrate and at least located in the display region, the pixel circuit layer including a plurality of surrounding pixel circuits, the plurality of surrounding pixel circuits being located in the main display region and at least partially surrounding the secondary display region; and a light-shielding layer located in the main display region and between the base substrate and the pixel circuit layer, an orthographic projection of the light-shielding layer on the base substrate at least partially overlapping with an orthographic projection of the plurality of surrounding pixel circuits on the base substrate.

In some embodiments, the light-shielding layer includes a plurality of light-shielding patterns. An orthographic projection of at least part of a surrounding pixel circuit on the base substrate is located within an orthographic projection of a light-shielding pattern on the base substrate.

In some embodiments, the surrounding pixel circuit includes a driving transistor, and an orthographic projection of an active layer of the driving transistor on the base substrate is located within the orthographic projection of the light-shielding pattern on the base substrate.

In some embodiments, the surrounding pixel circuit further includes a compensation transistor coupled to the driving transistor, and an orthographic projection of an active layer of the compensation transistor on the base substrate is located within the orthographic projection of the light-shielding pattern on the base substrate.

In some embodiments, the plurality of surrounding pixel circuits are arranged in a plurality of columns in a first direction and in a plurality of rows in a second direction. In some surrounding pixel circuits located on a same side of the secondary display region, light-shielding patterns corresponding to at least two surrounding pixel circuits adjacent in the first direction are connected, and/or light-shielding patterns corresponding to at least two surrounding pixel circuits adjacent in the second direction are connected.

In some embodiments, the plurality of light-shielding patterns are connected to be of an integrated structure. The light-shielding layer surrounds the secondary display region.

In some embodiments, the light-shielding layer includes at least two light-shielding rings arranged concentrically. Each light-shielding ring includes multiple connected light-shielding patterns, and the light-shielding ring surrounds at least part of the secondary display region.

In some embodiments, the light-shielding layer further includes at least one connection pattern, and two adjacent light-shielding patterns are connected to each other through a connection pattern.

In some embodiments, the display panel further includes a first voltage signal line and a transfer layer that are disposed in the pixel circuit layer. The light-shielding layer is connected to the first voltage signal line through the transfer layer.

In some embodiments, a material of the light-shielding layer includes molybdenum or graphite.

In some embodiments, the plurality of surrounding pixel circuits are arranged in a plurality of columns in a first direction and in a plurality of rows in a second direction. In the first direction, at least six columns of surrounding pixel circuits are disposed on any side in opposite sides of the secondary display region. In the second direction, at least three rows of surrounding pixel circuits are disposed on any side in opposite sides of the secondary display region.

In some embodiments, the pixel circuit layer further includes a plurality of redundant pixel circuits. The plurality of redundant pixel circuits are located in the main display region and surround at least part of the secondary display region, and the plurality of redundant pixel circuits are closer to the secondary display region than the plurality of surrounding pixel circuits.

In some embodiments, the plurality of surrounding pixel circuits are arranged in a plurality of columns in a first direction and in a plurality of rows in a second direction; and the plurality of redundant pixel circuits are arranged in at least one column in the first direction and in at least one row in the second direction. In the first direction, a sum of a number of columns of surrounding pixel circuits and a number of columns of redundant pixel circuits disposed on any side in opposite sides of the secondary display region is greater than or equal to 6. In the second direction, a sum of a number of rows of surrounding pixel circuits and a number of rows of redundant pixel circuits disposed on any side in opposite sides of the secondary display region is greater than or equal to 3.

In some embodiments, the display panel further includes a plurality of first light-emitting devices disposed in the main display region. The pixel circuit layer includes a plurality of first pixel circuits located in the main display region, and the plurality of first pixel circuits are coupled to the plurality of first light-emitting devices. At least some surrounding pixel circuits in the plurality of surrounding pixel circuits are first pixel circuits.

In some embodiments, the display panel further includes a plurality of second light-emitting devices disposed in the secondary display region. The pixel circuit layer includes a plurality of second pixel circuits located in the main display region, and the plurality of second pixel circuits are coupled to the plurality of second light-emitting devices through conductive lines. At least some surrounding pixel circuits in the plurality of surrounding pixel circuits are second pixel circuits.

In some embodiments, the display panel further includes a plurality of second light-emitting devices disposed in the secondary display region. The pixel circuit layer includes a plurality of second pixel circuits located in the secondary display region, and the plurality of second pixel circuits are coupled to the plurality of second light-emitting devices.

In some embodiments, the display panel further includes a plurality of second light-emitting devices located in the secondary display region. The display panel has a frame region located on at least one side of the display region. The pixel circuit layer includes a plurality of second pixel circuits located in the frame region, and the plurality of second pixel circuits are coupled to the plurality of second light-emitting devices through conductive lines.

In another aspect, a display apparatus is provided. The display apparatus includes the display panel as described in any of the above embodiments.

In some embodiments, the display apparatus further includes an optical element located on a side of the light-shielding layer away from the pixel circuit layer; and an orthographic projection of the optical element on the base substrate is located in the secondary display region.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on an actual size of a product to which the embodiments of the present disclosure relate.

DETAILED DESCRIPTION

Figure 1:
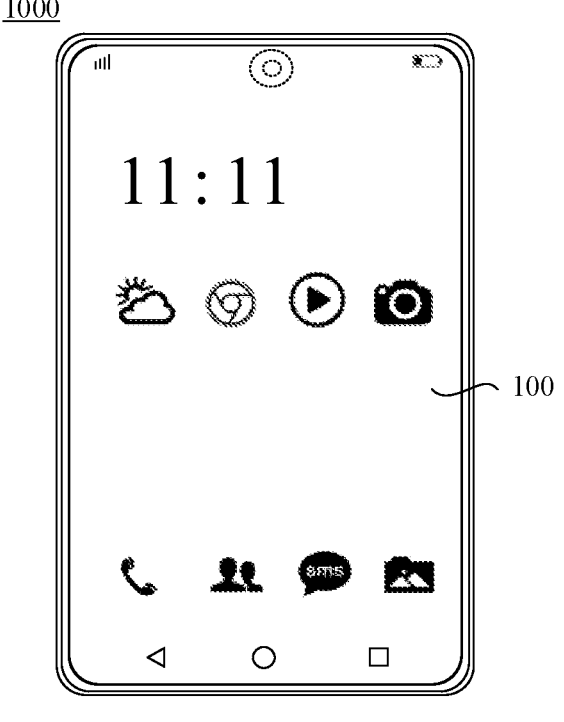
FIG. 1 is a structural diagram of a display apparatus, in accordance with some embodiments of the present disclosure.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics described herein may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, features defined with "first" or "second" may explicitly or implicitly include one or more of the features.

In the description of the embodiments of the present disclosure, term "a plurality of" or "the plurality of" means two or more unless otherwise specified.

In the description of some embodiments, the expressions "connected" and derivatives thereof may be used. For example, the term "connected" may be used in the description of some embodiments to indicate that two or more components are in direct physical or electrical contact with each other. The embodiments disclosed herein are not necessarily limited to the content herein.

The phrase "A and/or B" includes the following three combinations: only A, only B, and a combination of A and B.

As used herein, the term "if" is optionally construed as "when" or "in a case where" or "in response to determining that" or "in response to detecting", depending on the context. Similarly, the phrase "if it is determined that" or "if [a stated condition or event] is detected" is optionally construed as "in a case where it is determined that" or "in response to determining that" or "in a case where [the stated condition or event] is detected" or "in response to detecting [the stated condition or event]", depending on the context.

The phrase "applicable to" or "configured to" as used herein indicates an open and inclusive expression, which does not exclude apparatuses that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values exceeding those stated.

The term such as "about", "substantially" or "approximately" as used herein includes a stated value and an average value within an acceptable range of deviation of a particular value. The acceptable range of deviation is determined by a person of ordinary skill in the art in consideration of the measurement in question and errors associated with the measurement of a particular quantity (i.e., limitations of the measurement system).

The term such as "perpendicular" or "equal" as used herein includes a stated condition and a condition similar to the stated condition. A range of the similar condition is within an acceptable range of deviation. The acceptable range of deviation is determined by a person of ordinary skill in the art in view of measurement in question and errors associated with the measurement of a particular quantity (i.e., limitations of the measurement system). For example, the term "perpendicular" includes absolute perpendicularity and approximate perpendicularity, and an acceptable range of deviation of the approximate perpendicularity may be a deviation within 5°; and the term "equal" includes absolute equality and approximate equality, and an acceptable range of deviation of the approximate equality may be a difference between two equals being less than or equal to 5% of either of the two equals.

It will be understood that when a layer or element is referred to as being on another layer or substrate, the layer or element may be directly on the another layer or substrate, or there may be intermediate layer(s) between the layer or element and the another layer or substrate.

Exemplary embodiments are described herein with reference to sectional views and/or plan views as idealized exemplary drawings. In the accompanying drawings, thicknesses of layers and sizes of regions are enlarged for clarity. Variations in shapes relative to the accompanying drawings due to, for example, manufacturing technologies and/or tolerances may be envisaged. Therefore, the exemplary embodiments should not be construed to be limited to the shapes of regions shown herein, but to include deviations in the shapes due to, for example, manufacturing. For example, an etched region shown in a rectangular shape generally has a feature of being curved. Therefore, the regions shown in the accompanying drawings are schematic in nature, and their shapes are not intended to show actual shapes of the regions in an apparatus, and are not intended to limit the scope of the exemplary embodiments In a circuit (e.g., a pixel circuit) provided in the embodiments of the present disclosure, transistors adopted in the circuit structure may be thin film transistors (TFTs), field effect transistors (e.g., metal oxide semiconductor (MOS) transistors), or other switching devices with the same characteristics. The embodiments of the present disclosure are described by considering an example of the thin film transistors.

For all transistors used in the circuit provided in the embodiments of the present disclosure, a first electrode of each transistor is one of a source and a drain, and a second electrode of the transistor is the other of the source and the drain. Since the source and the drain of the transistor may be symmetrical in structure, there may be no difference in structure between the source and the drain of the transistor. That is, there may be no difference in structure between the first electrode and the second electrode of the transistor in the embodiments of the present disclosure. For example, for a P-type transistor, the first electrode of the transistor is the source, and the second electrode thereof is the drain. For another example, for the N-type transistor, the first electrode of the transistor is the drain, and the second electrode thereof is the source.

In the circuit provided in the embodiments of the present disclosure, the first node, the second node and the like do not represent actual components, but rather represent junctions of related electrical connections in a circuit diagram. That is, these nodes are nodes equivalent to the junctions of the related electrical connections in the circuit diagram.

Transistors included in the circuit provided in the embodiments of the present disclosure may all be N-type transistors, or all be P-type transistors, or some are N-type transistors, and the other are P-type transistors. In the present disclosure, "active level" refers to a level capable of turning on a transistor. The P-type transistor may be turned on under control of a low-level signal, and the N-type transistor may be turned on under control of a high-level signal.

The following will be described by considering an example where the transistors included in the circuits provided by the embodiments of the present disclosure are all P-type transistors. Some embodiments of the present disclosure provide a display panel 100 and a display apparatus 1000, and the display panel 100 and the display apparatus 1000 each will be described below.

Some embodiments of the present disclosure provide the display apparatus 1000, as shown in FIG. 1, the display apparatus 1000 may be any apparatus that displays images whether in motion (such as a video) or fixed (such as a still image), and regardless of text or image. More specifically, it is expected that the display apparatus in the embodiments may be applied to or associated with a variety of electronic devices, and the variety of electronic devices may include (but are not limited to), for example, mobile phones, wireless devices, personal digital assistants (PDAs), hand-held or portable computers, global positioning system (GPS) receivers/navigators, cameras, MPEG-4 Part 14 (MP4) video players, video cameras, game consoles, watches, clocks, calculators, TV monitors, flat-panel displays, computer monitors, car displays (e.g., odometer displays), navigators, cockpit controllers and/or displays, camera view displays (e.g., display of rear view camera in vehicles), electronic photos, electronic billboards or signs, projectors, architectural structures, packaging and aesthetic structures (e.g., displays for displaying an image of a piece of jewelry), etc.

Figure 3A:
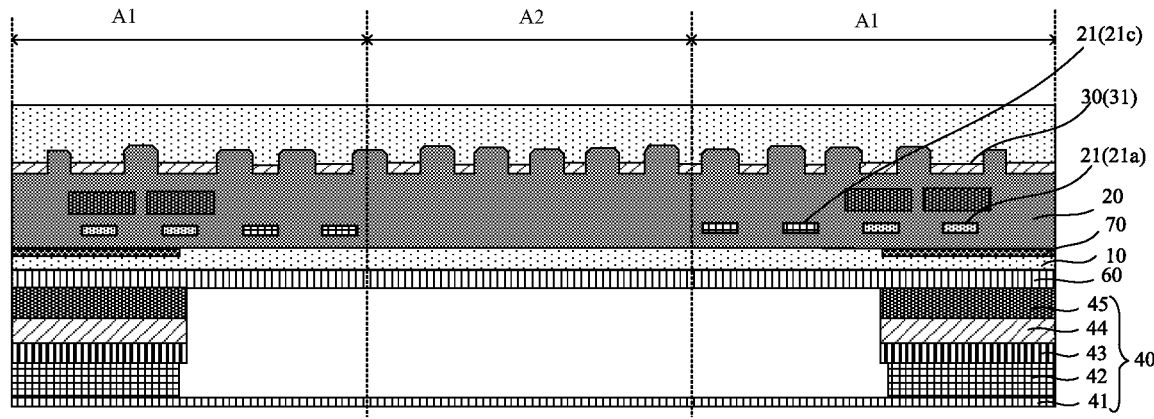
FIG. 3a is a structural diagram of another display apparatus, in accordance with some embodiments of the present disclosure.

In some embodiments, as shown in FIG. 3a, the display apparatus 1000 includes a heat dissipation film 40.

In some examples, the heat dissipation film 40 is located on a non-display side of the display apparatus 1000.

For example, the non-display side of the display apparatus 1000 refers to a side opposite to a side of the display apparatus for displaying images.

By adopting the above provision, heat in the display apparatus 1000 may be dissipated through the heat dissipation film 40 in time, so as to avoid the accumulation of the heat inside the display apparatus 1000, which may affect the display effect of the display apparatus 1000.

In some examples, the heat dissipation film 40 may include a protective layer 41, a heat dissipation layer 42, a buffer layer 43, a foam layer 44 and a grid adhesive layer 45 that are sequentially stacked.

For example, the material of the protective layer 41 may include peeling tape. The protection layer 41 may protect the heat dissipation film 40 and the display panel 100 before the display panel 100 and the optical elements mentioned below are assembled. During the assembly of the display apparatus 1000, for example, before the optical elements are assembled, the protective layer 41 in the heat dissipation film 40 may be peeled off.

For example, the material of the heat dissipation layer 42 may include copper foil. The copper foil may be self-adhesive copper foil, double conductive copper foil, single conductive copper foil, etc. All of the above copper foils have excellent conductivity. The heat in the display panel 100 may be dissipated through the heat dissipation layer 42, and the heat dissipation layer 42 may also play a role of electromagnetic shielding and electrostatic discharge for a pixel circuit layer 20 on a side of the base substrate 10.

For example, the material of the buffer layer 43 may include polyethylene terephthalate (PET) or the like. The buffer layer may buffer and dissipate the impact of external force on the heat dissipation film 40, so as to avoid damage to the heat dissipation film 40.

For example, the material of the foam layer 44 may include polyurethane foam, conductive foam, aluminum foil foam, etc. All of the above materials have good thermal conductivity, and may quickly dissipate the heat generated by the display panel 100, so as to prevent a decrease in display effect due to adverse effects on display panel 100 caused by heat accumulation. In addition, since the material of the foam layer is relatively soft, the display panel 100 may be protected. As a result, when an external force impacts the display panel 100, the external force may be absorbed and buffered, so as to avoid damage to the display panel 100.

For example, the material of the grid adhesive layer 45 may be pressure sensitive adhesive, and this material may make the heat dissipation film 40 and the base substrate 10 bonded, so as to realize the fixing between the heat dissipation film 40 and the base substrate 10.

Figure 3B:
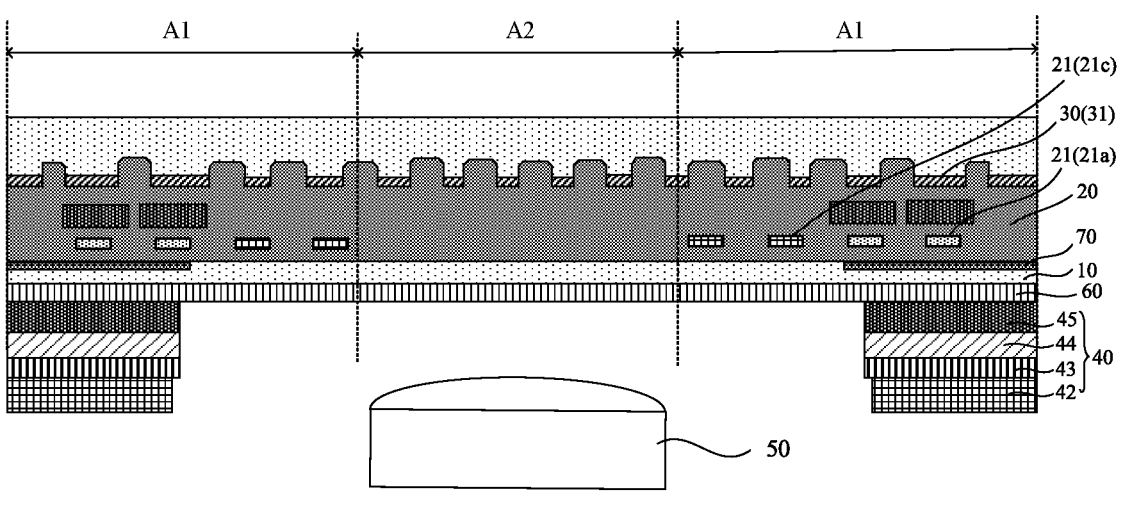
FIG. 3b is a structural diagram of yet another display apparatus, in accordance with some embodiments of the present disclosure.

In some examples, as shown in FIG. 3b, the heat dissipation film 40 has an opening, and the opening is disposed opposite to a secondary display region A2.

It should be noted that the above-mentioned opening of the heat dissipation film 40 refers to, as shown in FIG. 3b, a through hole in heat dissipation film 40 after protective layer 41 is peeled from the heat dissipation film 40. The through hole extends through the heat dissipation layer 42, the buffer layer 43, the foam layer 44, and the grid adhesive layer 45.

For example, a center of the opening of the heat dissipation film 40 may coincide with a center of the secondary display region A2, and an area of the opening of the heat dissipation film 40 may be greater than or equal to an area of the secondary display region A2.

In some examples, as shown in FIG. 3*b*, the display apparatus 1000 further includes an optical element 50.

For example, the optical element 50 may be a camera, an infrared sensor, a fingerprint sensor, or the like.

The embodiments of the present disclosure are described by considering an example of the optical element 50.

During working of the camera, external light may pass through a portion of the display apparatus 1000 located in the secondary display region A2 to enter the camera, so that the camera may collect the light to realize the function of photographing.

For example, an orthographic projection of the optical element 50 on the heat dissipation film 40 is located within the opening of the heat dissipation film 40 and within secondary display region A2.

For example, the optical element 50 is disposed opposite to the opening of the heat dissipation film 40, and an area of the orthographic projection of the optical element 50 on the heat dissipation film 40 is smaller than or equal to an area of the opening of the heat dissipation film 40. The optical element 50 is disposed opposite to the secondary display region A2, and the area of the orthographic projection of the optical element 50 on the heat dissipation film 40 is smaller than or equal to an area of the secondary display region A2.

It can be understood that the heat dissipation film 40 is generally arranged in an entire layer and is opaque. The opening is provided in the heat dissipation film 40, and the orthographic projection of the optical element 50 on the heat dissipation film 40 is located within the opening and within the secondary display region A2, so that the external light will not be blocked by the heat dissipation film 40 when passing through the secondary display region A2 and normally enter the optical element 50. Thus, it may be ensured that the optical element 50 collects enough light, thereby ensuring that the optical element 50 may work normally.

For example, as shown in FIG. 3*b*, the display apparatus 1000 further includes a back film 60 located between the base substrate 10 and the heat dissipation film 40.

For example, the back film 60 may cover a surface of the base substrate 10 proximate to the heat dissipation film 40, so as to protect the base substrate 10, the pixel circuit layer 20, a light-emitting device 30 and other structures, thereby avoiding damage to the above structures and ensuring normal display of the display panel 100.

For example, the material of the back film 60 may be a transparent material. The light incident on a surface of the back film 60 may pass through the back film 60 and exit from another surface of the back film 60. In this way, when the optical element 50 of the display apparatus 1000 is working, the external light may sequentially pass through the secondary display region A2 and the back film 60 of the display panel 100 to enter the optical element 50, so that the optical element 50 may collect enough light, thereby realizing the function of photographing.

For example, the display apparatus 1000 further includes a frame, a display driver integrated circuit (IC) and other electronic components.

In some embodiments, as shown in FIG. 1, the display apparatus 1000 includes the display panel 100.

Figure 2:
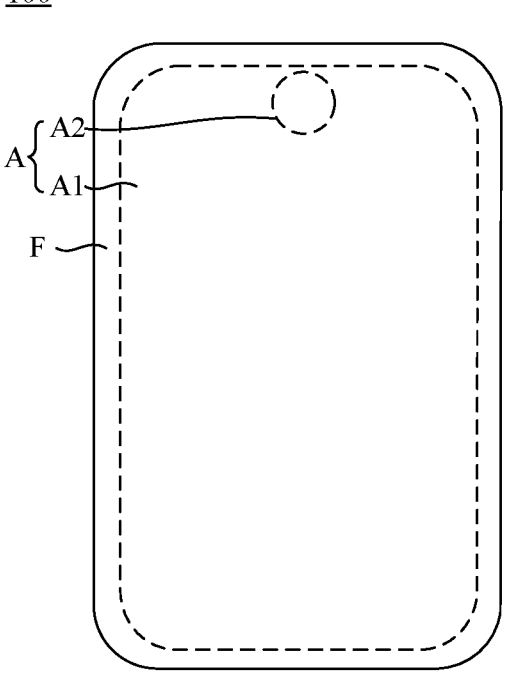
FIG. 2 is a structural diagram of a display panel, in accordance with some embodiments of the present disclosure.

In some embodiments, as shown in FIG. 2, the display panel 100 has a display region A and a frame region F disposed on at least one side of the display region A.

For example, the frame region F may surround a part of the display region A, that is, the frame region F may be located on one side, two sides, or three sides of the display region A. For another example, as shown in FIG. 2, the frame region F is around the display region A to surround the display region A.

In some examples, as shown in FIG. 2, the display region A of the display panel 100 includes a main display region A1 and the secondary display region A2, and the main display region A1 surrounds at least part of the secondary display region A2.

For example, the main display region A1 may surround a part of the secondary display region A2. For another example, as shown in FIG. 3*a*, the main display region A1 may be around the secondary display region A2 to surround the secondary display region A2.

Shapes of the display region A and the secondary display region A2 vary, which may be set according to actual needs.

For example, the display region A may be in a shape of a rectangle, an approximate rectangle, a circle, an ellipse, or the like. The approximate rectangle is a rectangle in a non-strict sense, and its four inner angles may be, for example, rounded, or a certain side thereof is, for example, not a straight line.

For example, the secondary display region A2 may also be in a shape of a rectangle, an approximate rectangle, a circle, an ellipse, or the like, which may be set according to actual needs.

For convenience of description, the embodiments of the present disclosure are described by considering an example where the secondary display region A2 is in the shape of the circle.

For example, a light transmittance of a portion of the display panel 100 located in the secondary display region A2 is greater than a light transmittance of a portion of the display panel 100 located in the main display region A1.

For example, the light may pass through the portion of the display panel 100 located in the secondary display region A2, and radiate from one side of the display panel 100 to the other side of the display panel 100.

In some examples, as shown in FIGS. 3*a* and 3*b*, the display panel 100 includes the base substrate 10, and the pixel circuit layer 20 and a light-emitting device layer 30 that are disposed on the side of the base substrate 10.

For example, the base substrate 10 may be a flexible base. The flexible base may be, for example, a polyethylene terephthalate (PET) base, a polyethylene naphthalate two formic acid glycol ester (PEN) base or a polyimide (PI) base. Therefore, the display panel 100 is a flexible display panel.

For example, the base substrate 10 is at least located in the display region A.

For example, the base substrate 10 may be located in the display region A of the display panel 100.

For another example, the base substrate 10 may be located in the display region A of the display panel 100 and the frame region F of the display panel 100.

For example, the pixel circuit layer 20 includes a plurality of pixel circuits 21. The light-emitting device layer 30 includes a plurality of light-emitting devices 31.

For example, the structure of the pixel circuit 21 varies, which may be set according to actual needs. For example, the pixel circuit 21 may include a "2T1C" structure, a "6T1C" structure, a "7T1C" structure, a "6T2C" structure, a "7T2C" structure, or the like. Here, "T" represents a thin film transistor, the number before "T" represents the number of the thin film transistors, "C" represents a storage capacitor, and the number before "C" represents the number of the storage capacitors.

Figure 7:
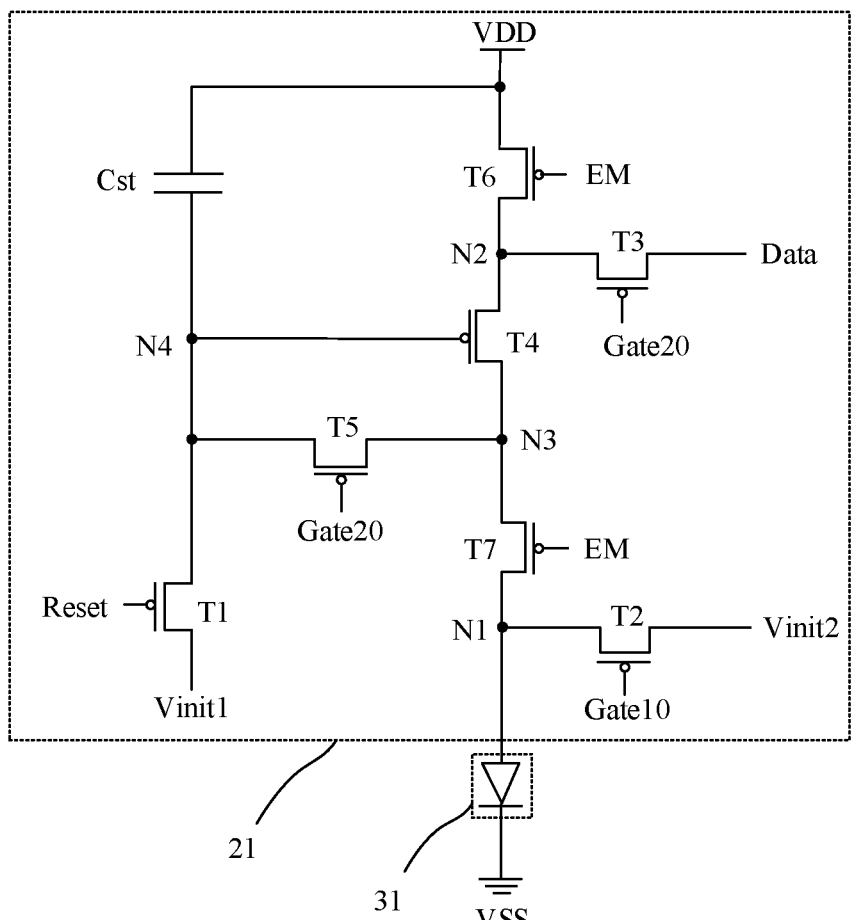
FIG. 7 is a structural diagram of a pixel circuit and a light-emitting device, in accordance with some embodiments of the present disclosure.

The present disclosure will be described by considering an example where the pixel circuit 21 has a "7T1C" structure. FIG. 7 shows an equivalent circuit diagram of the pixel circuit 21.

For example, as shown in FIG. 7, the pixel circuit 21 includes a first reset transistor T1, a second reset transistor T2, a switch transistor T3, a driving transistor T4, a compensation transistor T5, a first light-emitting control transistor T6, a second light-emitting control transistor T7, and a storage capacitor Cst.

For example, as shown in FIG. 7, a gate of the first reset transistor T1 is coupled to a reset signal line Reset, a first electrode of the first reset transistor T1 is coupled to a first initial signal line Vinit1, and a second electrode of the first reset transistor T1 is coupled to a fourth node N4 (i.e., coupled to a second electrode of the compensation transistor T5). The first reset transistor T1 is configured to be turned on under control of a reset signal transmitted by the reset signal line Reset to transmit a first initial signal received at the first initial signal line Vinit1 to the fourth node N4, so as to reset the fourth node N4.

For example, as shown in FIG. 7, a gate of the second reset transistor T2 is coupled to a first scanning signal line Gate10, a first electrode of the second reset transistor T2 is coupled to a second initial signal line Vinit2, and a second electrode of the second reset transistor T2 is coupled to a first node N1 (i.e., coupled to the light-emitting device 31). The second reset transistor T2 is configured to be turned on under control of a first scan signal transmitted by the first scan signal line Gate10 to transmit a second initial signal received at the second initial signal line Vinit2 to the first node N1, so as to reset the first node N1.

For example, as shown in FIG. 7, a gate of the switch transistor T3 is coupled to a second scanning signal line Gate20, a first electrode of the switch transistor T3 is coupled to a data line Data, and a second electrode of the switch transistor T3 is coupled to a second node N2 (i.e., coupled to a first electrode of the driving transistor T4). The switching transistor T3 is configured to be turned on under control of a second scanning signal transmitted by the second scanning signal line Gate20 to transmit a data signal received at the data line Data to the second node N2.

For example, as shown in FIG. 7, a gate of the driving transistor T4 is coupled to the fourth node N4, a first electrode of the driving transistor T4 is coupled to the second node N2, and a second electrode of the driving transistor T4 is coupled to a third node N3. The driving transistor T4 is configured to be turned on under control of a voltage of the fourth node N4 to transmit a signal (e.g., the data signal) from the second node N2 to the third node N3.

For example, as shown in FIG. 7, a gate of the compensation transistor T5 is coupled to the second scanning signal line Gate20, a first electrode of compensation transistor T5 is coupled to the third node N3 (i.e., coupled to the second electrode of the driving transistor T4), and the second electrode of the compensation transistor T5 is coupled to the fourth node N4 (i.e., coupled to the gate of driving transistor T4). The compensation transistor T5 is configured to be turned on under the control of the second scanning signal transmitted by the second scanning signal line Gate20 to transmit an electrical signal (e.g., the data signal) from the third node N3 to the fourth node N4.

For example, as shown in FIG. 7, a gate of the first light-emitting control transistor T6 is coupled to an enable signal line EM, a first electrode of the first light-emitting control transistor T6 is coupled to a first voltage signal line VDD, and a second electrode of the first light-emitting control transistor T6 is coupled to the second node N2. The first light-emitting control transistor T6 is configured to be turned on under control of an enable signal transmitted by the enable signal line EM to transmit a voltage signal received at the first voltage signal line VDD to the second node N2.

For example, as shown in FIG. 7, a gate of the second light-emitting control transistor T7 is coupled to the enable signal line EM, a first electrode of the second light-emitting control transistor T7 is coupled to the third node N3, and a second electrode of the second light-emitting control transistor T7 is coupled to the first node N1. The second light-emitting control transistor T7 is configured to be turned on under the control of the enable signal transmitted by the enable signal line EM to transmit an electrical signal (e.g., a voltage signal) from the third node N3 to the first node N1.

For example, as shown in FIG. 7, a first electrode of the storage capacitor Cst is coupled to the fourth node N4, and a second electrode of the storage capacitor Cst is coupled to the first voltage signal line VDD.

For example, the light-emitting device 31 may include an anode layer, a light-emitting functional layer and a cathode layer that are sequentially stacked. The light-emitting functional layer may include a light-emitting layer. Optionally, the light-emitting functional layer may further include at least one of a hole injection layer, a hole transport layer, an electron transport layer, and an electron injection layer.

For example, the pixel circuit may be coupled to the anode layer of the light-emitting device.

By applying a common voltage signal to the cathode layer of the light-emitting device 31, and applying a driving signal to the anode layer of the light-emitting device 31 using the corresponding pixel circuit 21, an electric field may be generated between the anode layer and the cathode layer of the light-emitting device 31. The electric field may drive different carriers (i.e., holes and electrons) to recombine in the light-emitting layer, so that the light-emitting device 31 emits light.

Optionally, the operation process of the pixel circuit 21 includes a reset phase, a data writing and compensation phase, and a light-emitting phase in sequence.

For example, in the reset phase, the first reset transistor T1 is turned on under the control of the reset signal to transmit the first initial signal to the fourth node N4, so as to reset the fourth node N4. Since the fourth node N4 is coupled to the first electrode of the storage capacitor Cst, the gate of the driving transistor T4, and the second electrode of the compensation transistor T5, when the fourth node N4 is reset, the first electrode of the storage capacitor Cst, the gate of the driving transistor T4, and the second electrode of the compensation transistor T5 may be reset synchronized. The driving transistor T4 may be turned on under the control of the first initial signal.

For example, in the data writing and compensation phase, the second reset transistor T2 is turned on under the control of the first scan signal, and the switch transistor T3 and the compensation transistor T5 are turned on under the control of the second scan signal. The second reset transistor T2 transmits the second initial signal to the first node N1, so as to reset the first node N1. Since the first node N1 is coupled to the anode of the light-emitting device 31, when the first node N1 is reset, the anode of the light-emitting device 31 may be reset synchronously. The switching transistor T3 transmits the data signal to the second node N2, the driving transistor T4 transmits the data signal from the second node N2 to the third node N3, and the compensation transistor T5 transmits the data signal from the third node N3 to the fourth node N4, so as to charge the driving transistor T4 until the compensation of the threshold voltage of the driving transistor T4 is completed.

For example, in the light-emitting phase, the first light-emitting control transistor T6 and the second light-emitting control transistor T7 are both turned on under the control of the enable signal. The first light-emitting control transistor T6 transmits the voltage signal to the second node N2, the driving transistor T4 transmits the voltage signal from the second node N2 to the third node N3, and the second light-emitting control transistor T7 transmits the voltage signal from the third node N3 to the first node N1.

For example, the driving current may be generated due to the action of the driving signal (e.g., the above voltage signal) from the first node N1 and the common voltage signal from a common voltage line VSS, and the light-emitting device 31 emits light due to the action of the driving current.

For example, the plurality of pixel circuits 21 and the plurality of light-emitting devices 31 may be coupled in a one-to-one correspondence. For another example, a pixel circuit 21 may be coupled to multiple light-emitting devices 31; alternatively, multiple pixel circuits 21 may be coupled to a light-emitting device 31. In the display panel 100, each light-emitting device 31 may emit light under the driving of the corresponding pixel circuit(s) 21, and lights emitted by the plurality of light-emitting devices 31 cooperate with each other, so that the display panel 100 realizes the display function.

Hereinafter, the structure of the display pane 100 will be described in the embodiments of the present disclosure by considering an example of a pixel circuit 21 corresponding to a light-emitting device 31.

It will be noted that FIGS. 3a and 3b only illustrate the positional relationship between the pixel circuit layer and the light-emitting device layer and the positional relationship between the pixel circuit and the light-emitting device, but do not illustrate the specific film layer relationship and the connection relationship between the pixel circuit and the light-emitting device. Therefore, FIGS. 3a and 3b do not limit the specific film layer relationship and the connection relationship between the pixel circuit and the light-emitting device.

Figure 5:
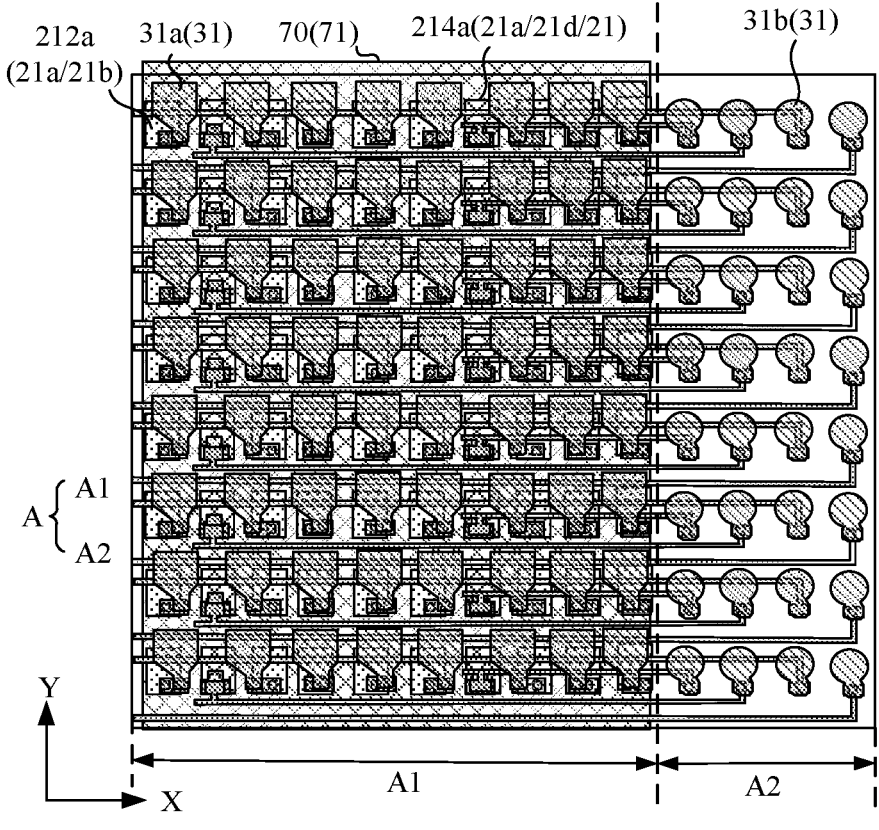
FIG. 5 is a partial structural diagram of a display panel, in accordance with some embodiments of the present disclosure.
Figure 6A:
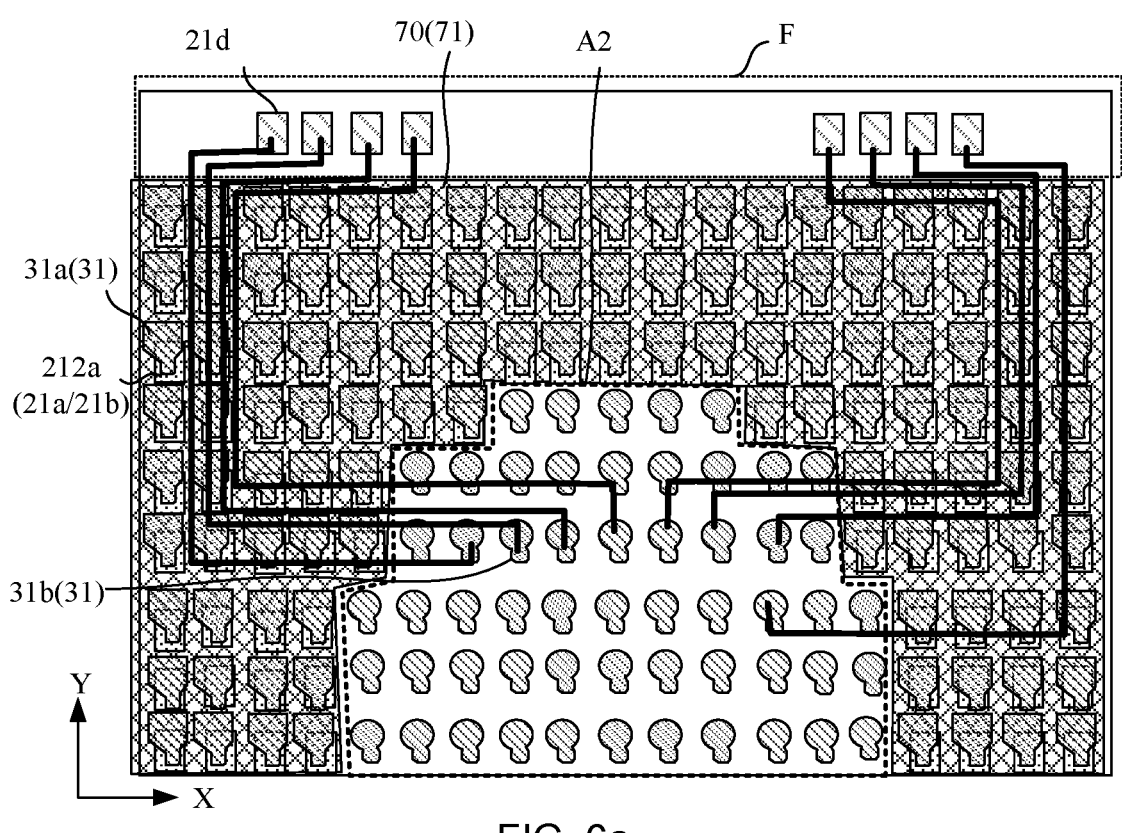
FIG. 6a is a partial structural diagram of another display panel, in accordance with some embodiments of the present disclosure.

For example, as shown in FIGS. 5 and 6a, the plurality of pixel circuits are located in a region other than the secondary display region A2. The plurality of light-emitting devices 31 are located in the display region A of the display panel 100, part of the light-emitting devices are located in the main display region, and a remaining part of the light-emitting devices are located in the secondary display region. The light-emitting devices 31 located in the main display region A1 are first light-emitting devices 31a, and the light-emitting devices 31 located in the secondary display region A2 are second light-emitting devices 31b. The pixel circuits 21 respectively coupled to a plurality of first light-emitting devices 31a are located in the main display region A1, and the pixel circuits 21 respectively coupled to a plurality of second light-emitting devices 31b are located in the main display region A1, the frame region F or the secondary display region A2. Thus, in the whole display region A of the display panel 100, the light-emitting devices 31 emit light under the driving of the pixel circuits 21, so that the display panel 100 realizes the full-screen display.

Figure 4A:
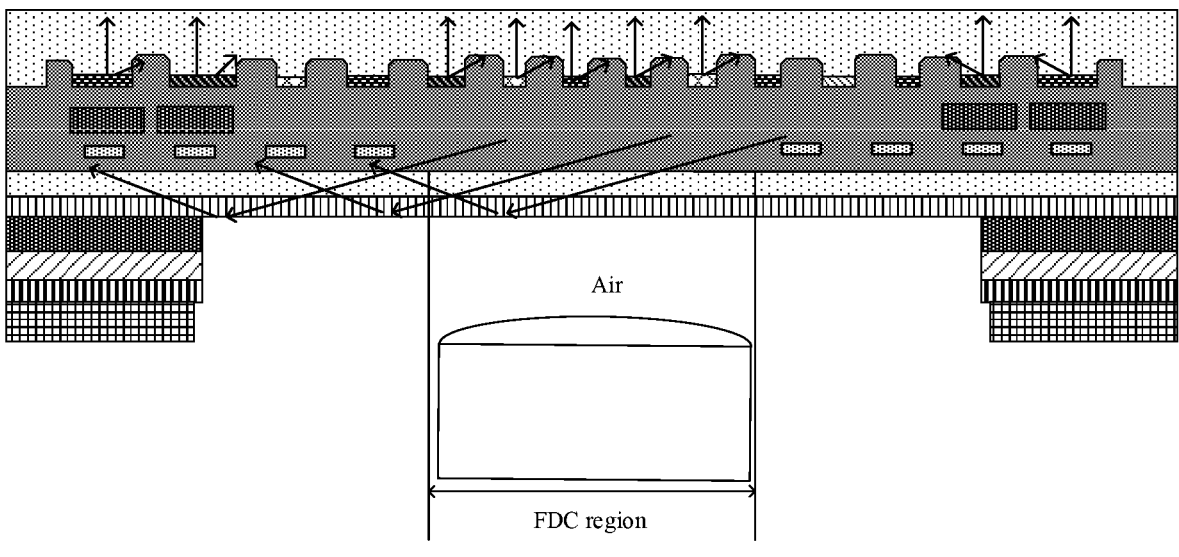
FIG. 4a is a structural diagram of a display apparatus in an implementation.

In an implementation, as shown in FIG. 4a, in the display apparatus, in order for the camera to work normally, a certain amount of external light needs to reach the camera through the full display with camera (FDC) region, so that the camera may obtain enough light for realizing the function of photographing (here, the FDC region refers to a region opposite to the camera in the thickness direction of the display apparatus). Therefore, a portion of the full-screen display apparatus located in the FDC region is provided to be light-transmittable, and for example, the FDC region corresponds to the above secondary display region A2.

However, in the full-screen display apparatus, external light and light emitted by the light-emitting devices will reach the interface between the back film and air (i.e., a lower surface of the back film) after a string of refraction and/or reflection. Since a refractive index of the material of the back film is greater than a refractive index of air, when an incident angle of the light incident on the interface satisfies the condition of total reflection, for example, when the incident angle of the light is greater than the critical angle, the light will be totally reflected at the interface, and is reflected to an active layer of a transistor in the pixel circuit located in a peripheral region of the FDC region, thereby causing the threshold voltage of the transistor in the pixel circuit to drift. By considering the driving transistor in the pixel circuit as an example, the light will cause the threshold voltage of the driving transistor to drift. As a result, when the pixel circuit is in the light-emitting phase, it is prone to reduce the driving current of the light-emitting device provided by the driving transistor, and further reduce the brightness of the display images in the peripheral region of the FDC region, resulting in the "progressive dark circle" phenomenon shown in FIG. 4d. This phenomenon generally appears continuously after the display apparatus starts to display the images for 5 minutes, and does not gradually disappear until about 6 hours after the display apparatus is turned off.

Figure 4B:
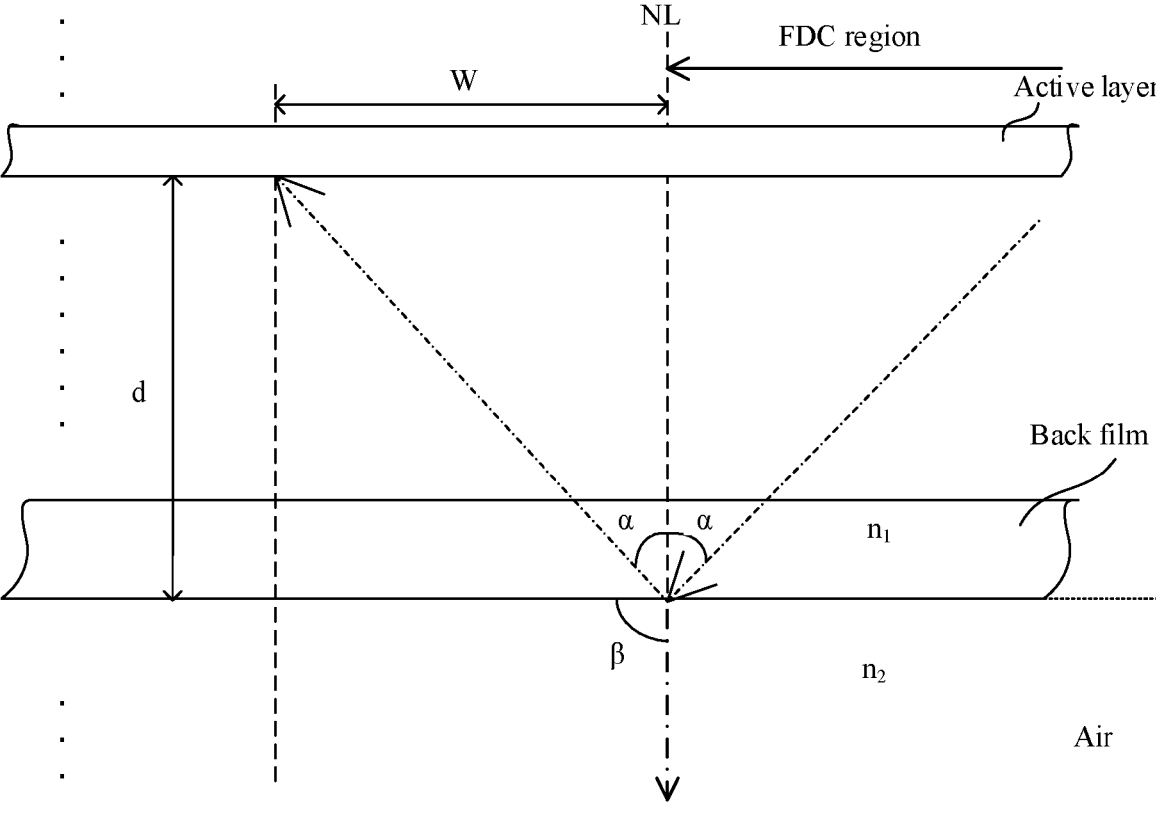
FIG. 4b is a schematic diagram of total reflection of light at the interface between a back film and air in an implementation.

It will be noted that, first, as shown in FIG. 4b, the incident angle of the light incident on the interface between the back film and air is set as a, the refractive index $n_1$ of the material of the back film is equal to 1.45 ($n_1$=1.45), the refractive index $n_2$ of air is equal to 1 ($n_2$=1), and the refraction angle is β. According to the law of refraction, all parameters satisfy the formula ($n_1 \times \sin \alpha = n_2 \times \sin \beta$). In a case where the refraction angle β is 90°, that is, in a case where the light happens to be totally reflected at the above-mentioned interface, the incident angle α is 44°. That is to say, the critical angle is 44°. If the incident angle α is greater than or equal to 44°, the light will be totally reflected at the interface. After the external light and the light emitted by the light-emitting devices undergo a string of refraction and/or reflection, in a case where the incident angle of the light incident on the interface between the back film and air is greater than or equal to 44°, the light will be totally reflected to be incident on the active layer of the driving transistor located in the peripheral region of the FDC region, so that the threshold voltage of the driving transistor drifts. Thus, in the light-emitting phase, it is prone to reduce the driving current of the light-emitting device provided by the driving transistor, and further reduce the brightness of the display images in the peripheral region of the FDC region, resulting in the "progressive dark circle" phenomenon shown in FIG. 4d.

Figure 4C:
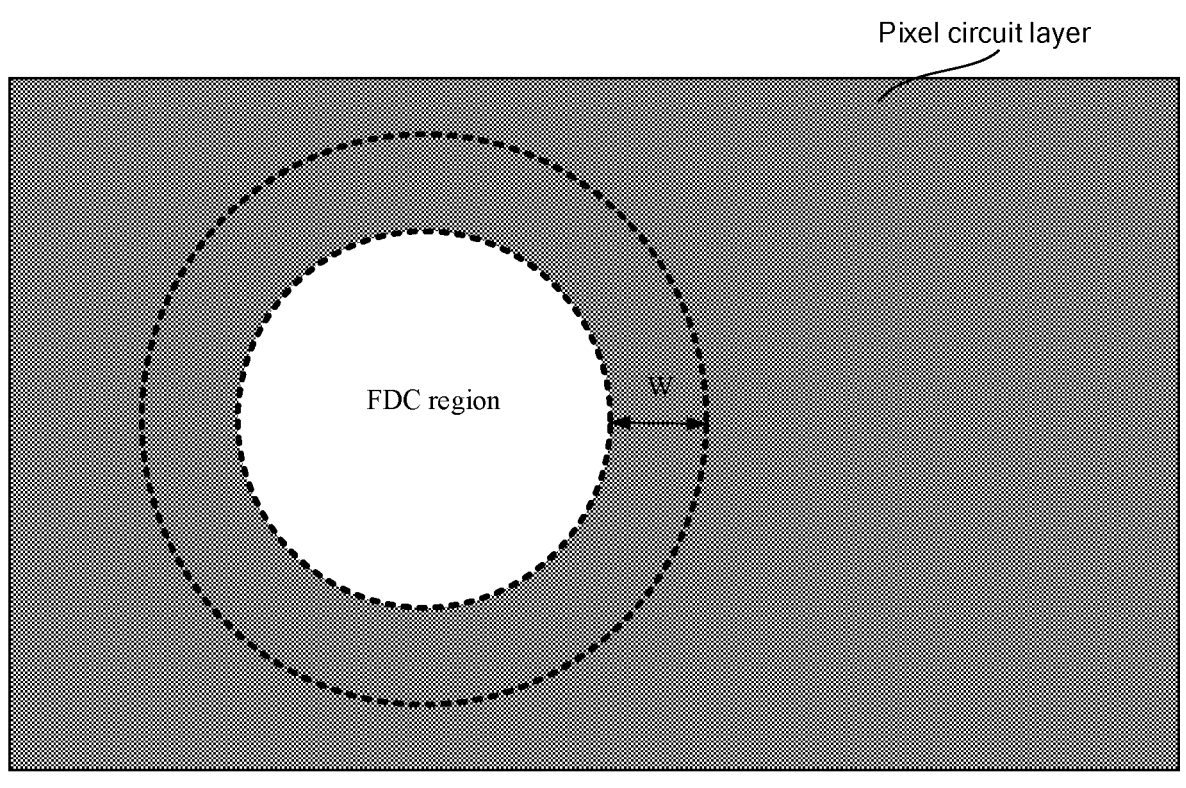
FIG. 4c is a structural diagram of a pixel circuit layer in a display panel in an implementation.
Figure 4D:
FIG. 4d is a schematic diagram of a "progressive dark circle" appearing on the display panel in an implementation.

Next, as shown in FIGS. 4b and 4c, a distance between a lower surface of the active layer of the transistor in the pixel circuit and the lower surface of the back film (i.e., the interface between the back film and air) is set as d, a normal line NL of the light incident on the interface between the back film and air is located at a boundary line of the FDC region, and in a region where the light after total reflection at the interface between the back film and air may irradiate, a maximum distance between an edge of the region and the boundary line of the FDC region is W. For example, d is equal to 11 μm (d=11 μm), and it may be obtained that W is equal to 96 μm (W=96 μm) according to the formula (tan α=W/d). That is to say, after the external light and the light emitted by the light-emitting devices undergo a string of refraction and/or reflection, in a case where the incident angle of the light incident on the interface between the back film and air is greater than or equal to 44°, the light will be totally reflected to be incident on the peripheral region of the FDC region, and the peripheral region of the FDC region is a region having a distance between an edge thereof and the boundary line of the FDC region less than or equal to 96 μm. The active layers of the driving transistors in the peripheral region of the FDC region will all be affected by the light, resulting in drift of the threshold voltages of the driving transistors. As a result, when the pixel circuit is in the light-emitting phase, it is prone to reduce the driving current of the light-emitting device provided by the driving transistor, and further reduce the brightness of the display images in the peripheral region of the FDC region, resulting in the "progressive dark circle" phenomenon shown in FIG. 4d.

A simulation test is carried out on the driving transistors in the pixel circuit corresponding to the above-mentioned "progressive dark circle". Driving currents I, display brightnesses, and other data corresponding to different threshold voltages Vth of the driving transistor under the same preset grayscale, and driving currents I, display brightnesses and other data corresponding to the threshold voltage Vth of the driving transistor under different preset grayscales L64, L128, and L255 may be obtained. The specific data is shown in Table 1.

TABLE 1

| Preset grayscale | Threshold voltage Vth | Driving current I | Driving current variation ΔI | Driving current varying percentage ΔI % | Display brightness |
|---|---|---|---|---|---|
| L64 | −2.7 | 2.092 | — | — | 22.72 |
|  | −2.6 | 1.992 | −0.1 | −4.80% | 21.63 |
|  | −2.5 | 1.895 | −0.097 | −4.87% | 20.57 |
|  | −2.4 | 1.801 | −0.094 | −4.94% | 19.56 |
|  | −2.3 | 1.711 | −0.09 | −5.02% | 18.58 |
|  | −2.2 | 1.624 | −0.087 | −5.09% | 17.63 |
|  | −2.1 | 1.54 | −0.084 | −5.15% | 16.72 |
| L128 | −2.7 | 10.035 | — | — | 108.85 |
|  | −2.6 | 9.746 | −0.289 | −2.88% | 105.71 |
|  | −2.5 | 9.457 | −0.289 | −2.97% | 102.57 |
|  | −2.4 | 9.175 | −0.282 | −2.98% | 99.52 |
|  | −2.3 | 8.899 | −0.276 | −3.01% | 96.53 |
|  | −2.2 | 8.626 | −0.273 | −3.07% | 93.57 |
|  | −2.1 | 8.36 | −0.266 | −3.08% | 90.68 |
| L255 | −2.7 | 51.772 | — | — | 561.56 |
|  | −2.6 | 50.798 | −0.974 | −1.88% | 550.99 |
|  | −2.5 | 49.817 | −0.981 | −1.93% | 540.35 |
|  | −2.4 | 48.826 | −0.991 | −1.99% | 529.60 |
|  | −2.3 | 47.824 | −1.002 | −2.05% | 518.74 |
|  | −2.2 | 46.829 | −0.995 | −2.08% | 507.94 |
|  | −2.1 | 45.831 | −0.998 | −2.13% | 497.12 |

Considering the preset grayscale L64 as an example, referring to Table 1, when the threshold voltage Vth of the driving transistor drifts from −2.7 to −2.1, the driving current provided by the driving transistor varies from 2.092 to 1.54, the varying percentage of driving current under this preset grayscale varies from −4.80% to −5.15%, and the actual display brightness varies from 22.72 to 16.72. It can be seen that in a case of the same preset grayscale, the threshold voltage of the driving transistor drifts due to the active layer of the driving transistor being illuminated, which in turn causes the actual display brightness of the light-emitting device to change (i.e., the display brightness decreases). As a result, a brightness difference recognizable to the human eye occurs, that is, the "progressive dark circle" phenomenon mentioned above appears.

Figure 4E:
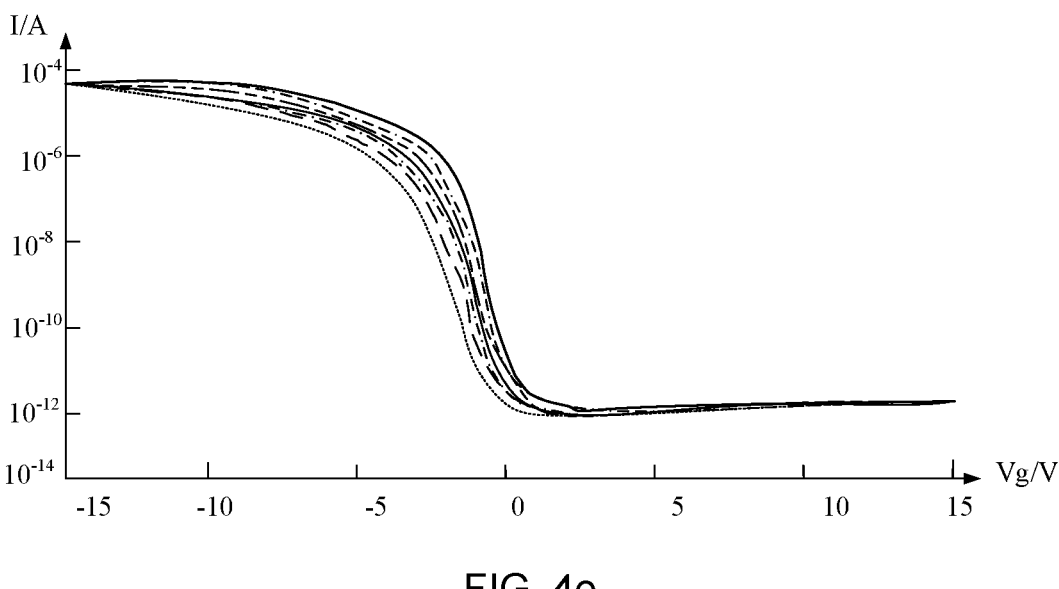
FIG. 4e is a schematic diagram of a characteristic transfer line of a driving transistor in a display panel at a preset gray scale of L64 in an implementation.
Figure 4F:
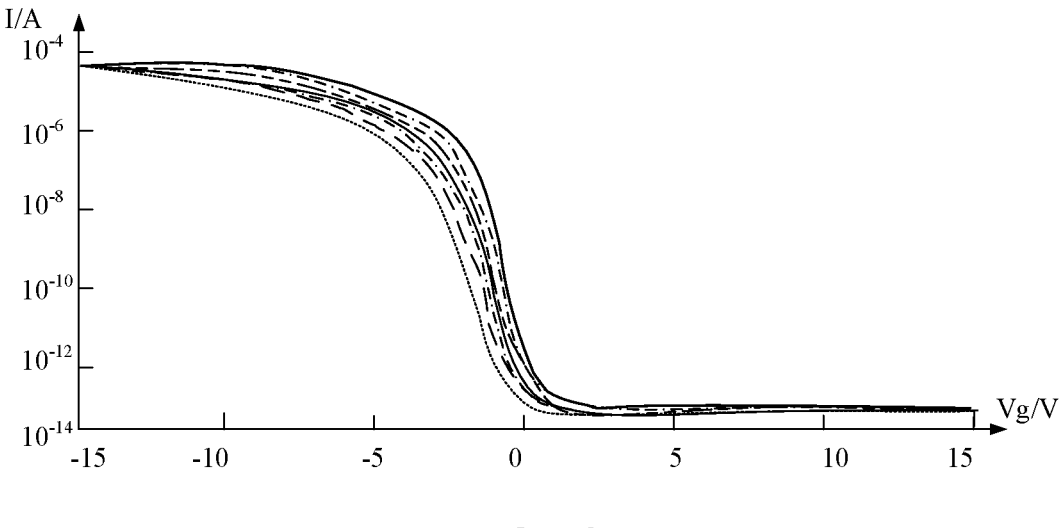
FIG. 4f is a schematic diagram of a characteristic transfer line of a driving transistor in a display panel at a preset gray scale of L128 in an implementation.

In a case where the preset grayscale is L64, and the threshold voltages of the driving transistor are −2.7, −2.6, −2.5, −2.4, −2.3, −2.2, −2.1, a simulation test is carried out on the gate voltage Vg and the driving current I of the driving transistor, and the simulation result is drawn as a corresponding characteristic curve Vg-I shown in FIG. 4e. In a case where the preset grayscale is L128, and the threshold voltages of the driving transistor are −2.7, −2.6, −2.5, −2.4, −2.3, −2.2, −2.1, a simulation test is carried out on the gate voltage Vg and the driving current I of the driving transistor, and the simulation result is drawn as a corresponding characteristic curve Vg-I shown in FIG. 4f. It can be seen that under the same preset grayscale, if the threshold voltages of the driving transistor are different and the gate voltages Vg of the driving transistor are the same, the corresponding driving currents are different. The larger the drift of the threshold voltage of the driving transistor is, the smaller the corresponding driving current is, and the lower the display brightness of the light-emitting device is, that is, the darker the display image is. Under different preset grayscales, the drift of the threshold voltage of the driving transistor may cause a significant change in the corresponding driving current, thereby reducing the actual luminance of the light-emitting device and causing the "progressive dark circle" phenomenon.

In light of this, as shown in FIG. 5, in the display panel 100 provided in some embodiments of the present disclosure, the pixel circuit layer 20 is at least located in the display region A, and the plurality of pixel circuits 21 in the pixel circuit layer 20 include a plurality of surrounding pixels circuits 21a.

In some examples, a whole of the pixel circuit layer 20 may be located in the display region A. For example, a whole of the pixel circuit layer 20 may be located in the main display region A1. For another example, a part of the pixel circuit layer 20 may be located in the main display region A1, and a remaining part of the pixel circuit layer 20 may be located in the secondary display region A2.

In some other examples, a part of the pixel circuit layer 20 may be located in the display region A, and a remaining part of the pixel circuit layer 20 may be located in another region of the display panel 100, such as in the frame region F.

For example, the plurality of pixel circuits 21 located in the main display region A1 may all be the surrounding pixel circuits 21a. For another example, the plurality of pixel circuits 21 located in the main display region A1 may include a plurality of surrounding pixel circuits 21a and a plurality of other pixel circuits. For other pixel circuits, reference may be made to the description below, and details are not provided here.

In some examples, the plurality of surrounding pixel circuits 21a are arranged in an array.

For example, the plurality of surrounding pixel circuits 21$a$ are arranged in a plurality of columns in the first direction X, and are arranged in a plurality of rows in the second direction Y.

For example, an included angle between the first direction X and the second direction Y may be 80°, 85°, 90°, 95° or 100°.

For the convenience of description, the present disclosure is described by considering an example where the included angle between the first direction X and the second direction Y is 90°.

In some examples, as shown in FIGS. 5 and 6$a$, the plurality of surrounding pixel circuits 21$a$ are located in the main display region A1 of the display panel 100.

For example, the plurality of pixel circuits 21 located in the main display region A1 are all the surrounding pixel circuits 21$a$. The plurality of surrounding pixel circuits 21$a$ include, for example, a plurality of first surrounding pixel circuits 212$a$ and a plurality of second surrounding pixel circuits 214$a$. In the plurality of surrounding pixel circuits 21$a$, the first surrounding pixel circuit 212$a$ is coupled to the first light-emitting device 31$a$ located in the main display region A1, and the second surrounding pixel circuit 214$a$ is coupled to the second light-emitting device 31$b$ located in the secondary display region A2.

In order to clearly illustrate the connection relationship between the second surrounding pixel circuits 214$a$ and the second light-emitting devices 31$b$, FIG. 5 only shows the connection between some second surrounding pixel circuits 214$a$ and corresponding second light-emitting devices 31$b$.

For example, the plurality of surrounding pixel circuits 21$a$ may all be located in the main display region A1 of the display panel 100. As shown in FIG. 5, the first surrounding pixel circuits 212$a$ and the second surrounding pixel circuits 214$a$ may be arranged in the plurality of columns in the first direction X and in the plurality of rows in the second direction Y. At least one column of first surrounding pixel circuits 212$a$ may be arranged between two adjacent columns of second surrounding pixel circuits 214$a$. In this way, it is possible to avoid providing the pixel circuits 21 coupled to the second light-emitting devices 31$b$ in the frame region F of the display panel 100, reduce the width of the frame region F of the display panel 100, and further improve the screen-to-body ratio of the display panel 100 and the display apparatus 1000, which is beneficial to realizing the full-screen display of the display panel 100 and the display apparatus 1000.

For example, the plurality of surrounding pixel circuits 21$a$ may partially surround the secondary display region A2. For another example, the plurality of surrounding pixel circuits 21$a$ may completely surround the secondary display region A2.

In some embodiments, as shown in FIG. 3$b$, the display pane 100 further includes the light-shielding layer 70 located between the base substrate 10 and the pixel circuit layer 20.

For example, the light-shielding layer 70 may be located in the main display region A1 of the display panel 100.

For example, the light-shielding layer 70 may reflect or absorb light incident on its surface, and the light substantially cannot pass through the light-shielding layer 70 from a side of the light-shielding layer 70 and exit from the other side of the light-shielding layer 70.

In some embodiments, an orthographic projection of the light-shielding layer 70 on the base substrate 10 at least partially overlaps with an orthographic projection of the plurality of surrounding pixel circuits 21$a$ on the base substrate 10.

For example, as shown in FIGS. 8$a$ and 8$b$, a part of an orthographic projection of a surrounding pixel circuit 21$a$ on the base substrate 10 coincides with a part of the orthographic projection of the light-shielding layer 70 on the base substrate 10. That is to say, a part of the surrounding pixel circuit 21$a$ corresponds to the light-shielding layer 70, and the part of the orthographic projection of the surrounding pixel circuit 21$a$ on the base substrate 10 coincides with at least part of the orthographic projection of the light-shielding layer 70 on the base substrate 10.

For example, the part of the orthographic projection of the surrounding pixel circuit 21$a$ on the base substrate 10 includes an orthographic projection of the active layer of at least one transistor in the surrounding pixel circuit 21$a$ on the base substrate 10.

With the above provision manner, after the external light and the light emitted by the light-emitting devices undergo a string of refraction and/or reflection and are incident onto the interface between the back film 60 and air, part of the light may be totally reflected at the interface and then directed towards the interior of the display panel 100. The part of light, undergoing the total reflection and entering the interior of the display panel 100, will be blocked by the light-shielding layer 70. In this way, it may be possible to prevent the part of light from being irradiated on structures of the surrounding pixel circuit 21$a$ corresponding to the light-shielding layer 70 (e.g., the active layer of at least one transistor in the surrounding pixel circuit 21$a$), and improve the drift of the threshold voltage of the surrounding pixel circuit 21$a$. Therefore, the reduction of the driving current of the surrounding pixel circuit 21$a$ may be improved, the decrease in the display brightness may be improved, and the "progressive dark circle" phenomenon of the display panel 100 and the display apparatus 1000 may be retarded.

Figure 9A:
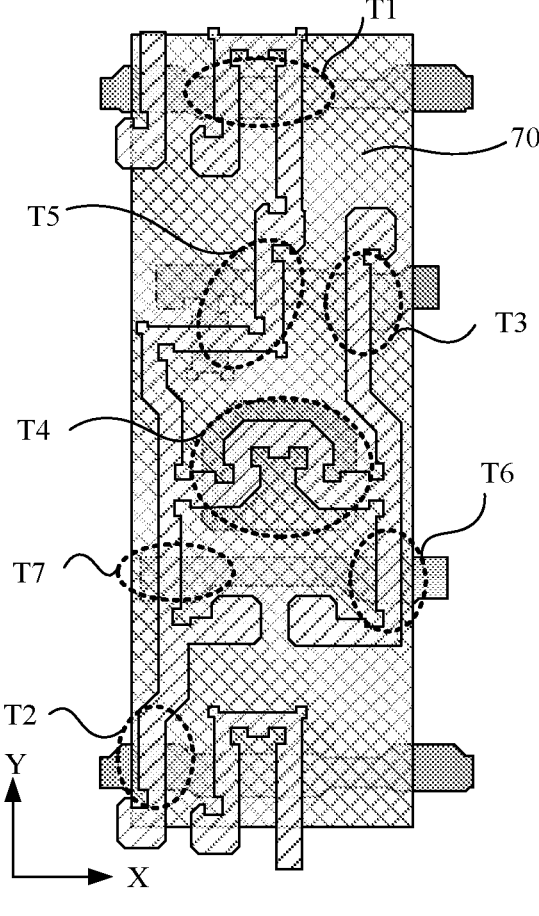
FIG. 9a is a top view of yet some other film layers in a display panel, in accordance with some embodiments of the present disclosure.

For example, as shown in FIGS. 9$a$ and 9$b$, the orthogonal projection of the surrounding pixel circuit 21$a$ on the base substrate 10 is located within the orthogonal projection of the light-shielding layer 70 on the base substrate 10. That is, the surrounding pixel circuit 21$a$ corresponds to the light-shielding layer 70 as a whole, and at least part of the orthographic projection of the surrounding pixel circuit 21$a$ on the base substrate 10 coincides with at least part of the orthographic projection of the light-shielding layer 70 on the base substrate 10.

For example, the orthographic projection of the surrounding pixel circuit 21$a$ on the base substrate 10 includes orthographic projections of a plurality of transistors included in the surrounding pixel circuit 21$a$ on the base substrate 10. In this case, as shown in FIG. 9$a$, the light-shielding layer 70 may block a region where all the transistors in the surrounding pixel circuit 21$a$ are located, which may simplify the manufacturing process of the light-shielding layer 70.

For another example, the orthographic projection of the surrounding pixel circuit 21$a$ on the base substrate 10 includes orthographic projections of active layers of the plurality of transistors included in the surrounding pixel circuit 21$a$ on the base substrate 10. In this case, the light-shielding layer 70 may be patterned, as shown in FIG. 9$b$, to only block the active layer of each transistor in the surrounding pixel circuit 21$a$.

With the above provision manner, after the external light and the light emitted by the light-emitting devices undergo a string of refraction and/or reflection and are incident onto the interface between the back film 60 and air, part of the light may be totally reflected at the interface and then directed towards the interior of the display panel 100. The part of light, undergoing the total reflection and entering the interior of the display panel 100, will be blocked by the light-shielding layer 70. In this way, it may be possible to prevent the part of light from being irradiated on each transistor in the surrounding pixel circuit 21a, and improve the drift of the threshold voltage of each surrounding pixel circuit 21a. Therefore, the reduction of the driving current of the surrounding pixel circuit 21a may be improved or even eliminated, the decrease in the display brightness may be improved or even eliminated, and the "progressive dark circle" phenomenon of the display panel 100 and the display apparatus 1000 may be retarded or even eliminated.

Figure 10:
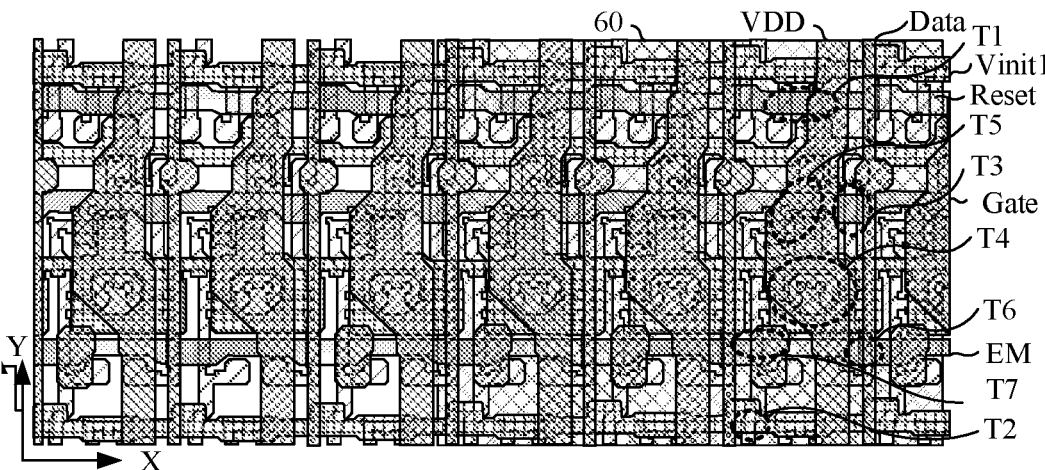
FIG. 10 is a top view of yet some other film layers in a display panel, in accordance with some embodiments of the present disclosure.

For example, as shown in FIG. 10, the orthographic projections of the plurality of surrounding pixel circuits 21a in the pixel circuit layer 20 on the base substrate 10 are within an orthographic projection of the light-shielding layer 70 on the base substrate 10.

With the above provision manner, the light-shielding layer 70 may be used to block the part of light that is totally reflected and directed towards the interior of the display panel 100, so as to prevent it from being irradiated to the plurality of surrounding pixel circuits 21a, thereby improving the drift of the threshold voltage of the surrounding pixel circuits 21a. Therefore, the reduction of the driving current of the surrounding pixel circuit 21a may be improved or even eliminated, the decrease in the display brightness may be improved or even eliminated, and the "progressive dark circle" phenomenon of the display panel 100 and the display apparatus 1000 may be retarded or even eliminated.

Figure 11:
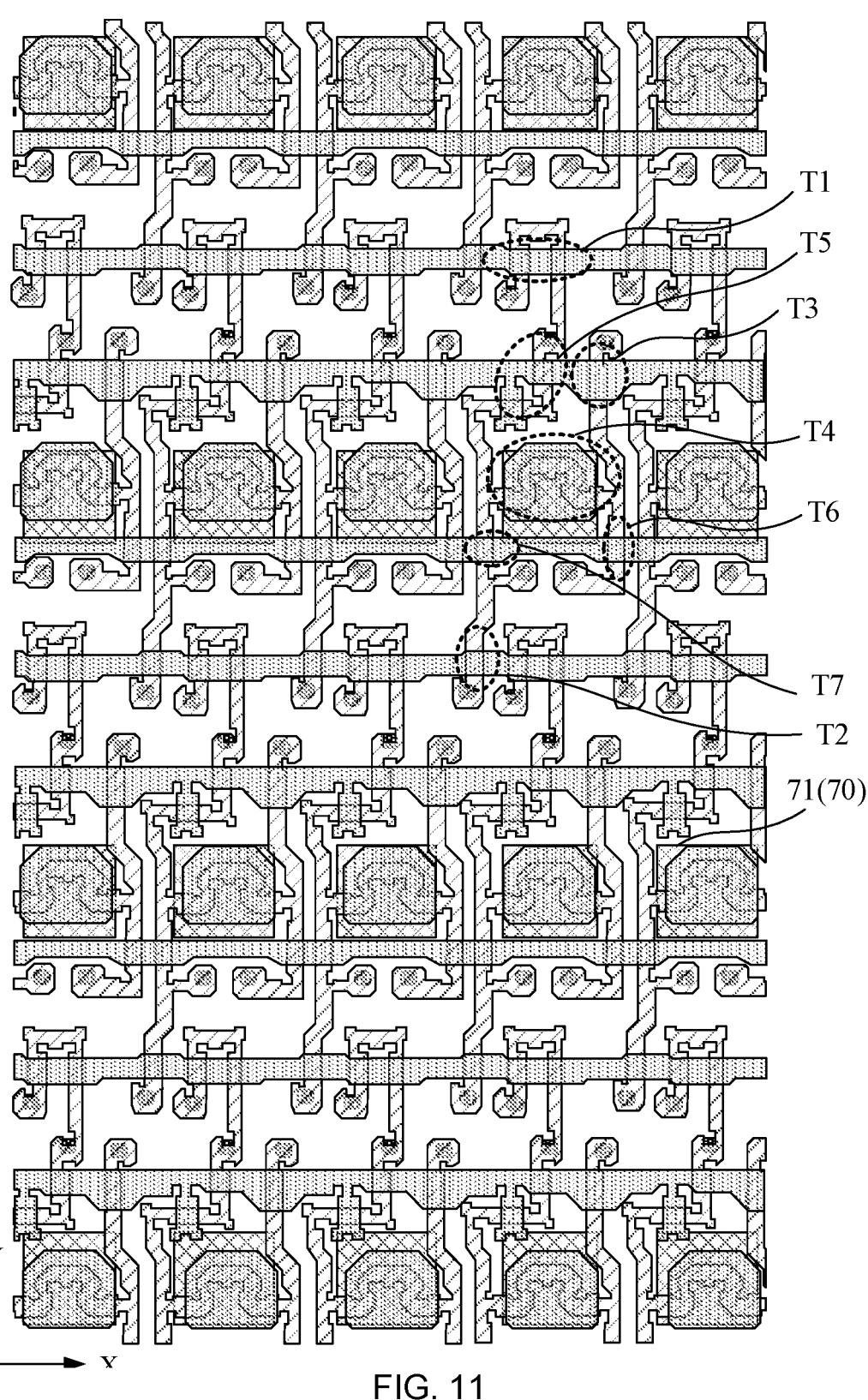
FIG. 11 is a top view of yet some other film layers in a display panel, in accordance with some embodiments of the present disclosure.
Figure 12A:
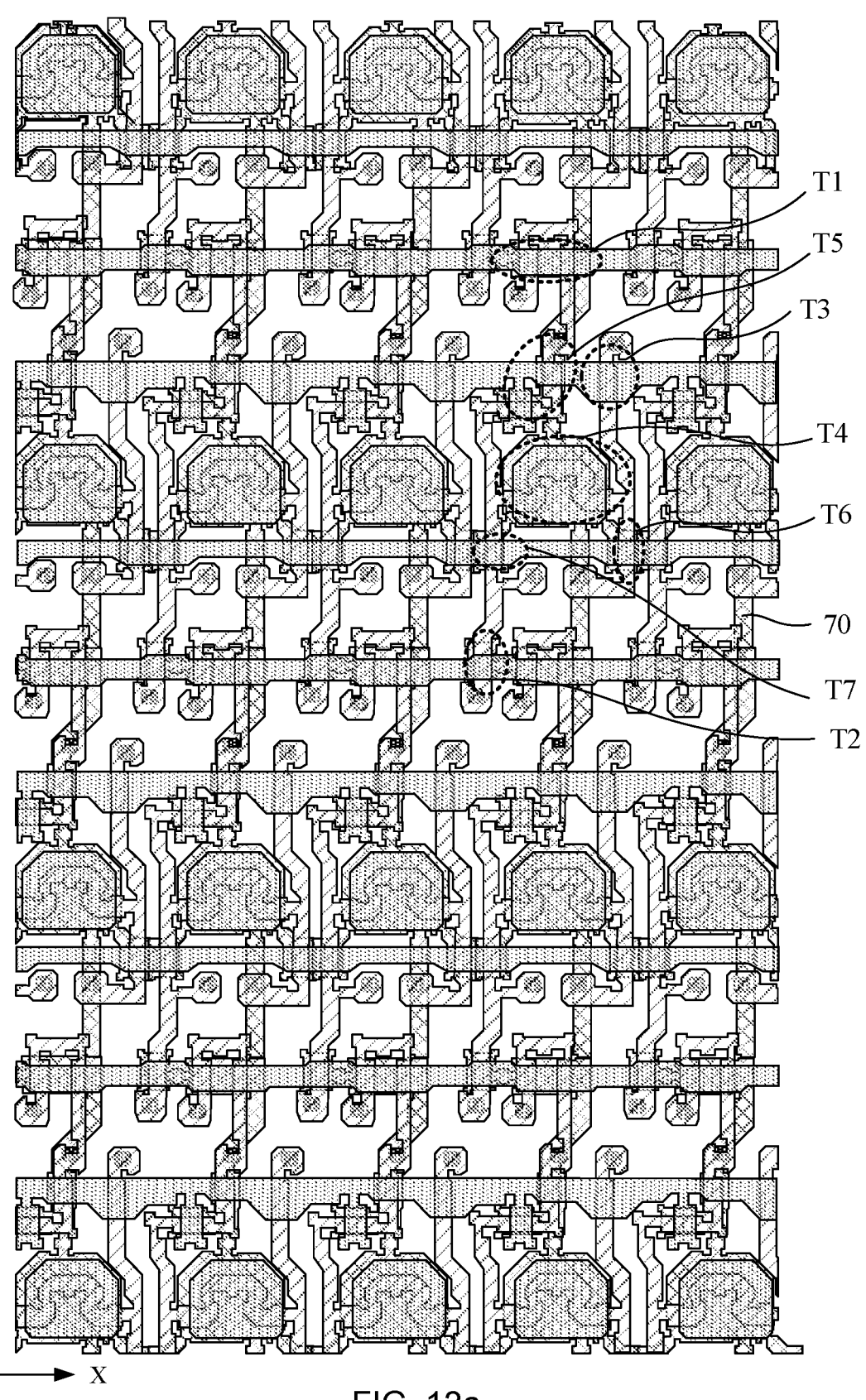
FIG. 12a is a top view of yet some other film layers in a display panel, in accordance with some embodiments of the present disclosure.

In some examples, as shown in FIGS. 11 and 12a, the light-shielding layer 70 includes a plurality of light-shielding patterns 71. An orthogonal projection of at least part of the surrounding pixel circuit 21a on the base substrate 10 is located within an orthogonal projection of a light-shielding pattern 71 on the base substrate 10.

For example, an orthogonal projection of a part or a whole of the surrounding pixel circuit 21a on the base substrate 10 is located within the orthogonal projection of the light-shielding pattern 71 on the base substrate 10.

For example, an orthographic projection of a part of a transistor in the surrounding pixel circuit 21a on the base substrate 10 is located within the orthographic projection of the light-shielding pattern 71 on the base substrate 10. For another example, an orthographic projection of a transistor in the surrounding pixel circuit 21a on the base substrate 10 is located within the orthographic projection of the light-shielding pattern 71 on the base substrate 10. For another example, an orthographic projection of a part of the plurality of transistors in the surrounding pixel circuit 21a on the base substrate 10 is located within the orthographic projection of the light-shielding pattern 71 on the base substrate 10. For another example, an orthographic projection of the plurality of transistors in the surrounding pixel circuit 21a on the base substrate 10 is located within the orthographic projection of the light-shielding pattern 71 on the base substrate 10.

For example, the shape of the light-shielding pattern 71 may vary, which may be set according to actual conditions.

For example, the light-shielding pattern 71 may be in a shape of a polygon or a fold line.

For example, the plurality of light-shielding patterns 71 and the plurality of surrounding pixel circuits 21a are in one-to-one correspondence. That is, each light-shielding pattern 71 corresponds to a respective surrounding pixel circuit 21a. A light-shielding pattern 71 is disposed opposite to at least part of a surrounding pixel circuit 21a.

The plurality of surrounding pixel circuits 21a surround the secondary display region A2, and the plurality of light-shielding patterns 71 in the light-shielding layer 70 are provided corresponding to the plurality of surrounding pixel circuits 21a. Therefore, the plurality of light-shielding patterns 71 in the light-shielding layer 70 are provided around the secondary display region A2.

In some embodiments, the surrounding pixel circuit 21a may include the driving transistor T4.

Figure 8A:
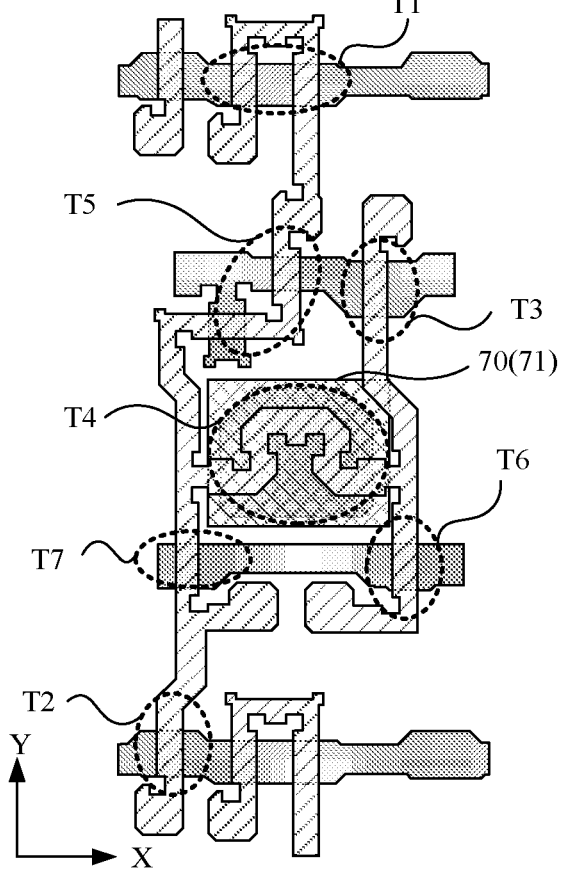
FIG. 8a is a top view of some film layers in a display panel, in accordance with some embodiments of the present disclosure.

In some examples, as shown in FIG. 8a, an orthographic projection of an active layer of the driving transistor T4 on the base substrate 10 is located within an orthographic projection of the light-shielding layer 71 on the base substrate 10. Here, a part of the surrounding pixel circuit 21a refers to, for example, the active layer of the driving transistor T4.

For example, a boundary line of the orthographic projection of the active layer of the driving transistor T4 on the base substrate 10 is located within a boundary line of the orthographic projection of the light-shielding pattern 71 on the base substrate 10. Alternatively, the boundary line of the orthographic projection of the active layer of the driving transistor T4 on the base substrate 10 at least partially coincides with the boundary line of the orthographic projection of the light-shielding pattern 71 on the base substrate 10.

With the above provision manner, after the external light and the light emitted by the light-emitting devices undergo a string of refraction and/or reflection and are incident onto the interface between the back film 60 and air, part of the light may be totally reflected at the interface and then directed towards the interior of the display panel 100. This part of light undergoing the total reflection will be blocked by the light-shielding pattern 71 in the light-shielding layer 70 before entering the active layer of the driving transistor T4 in the at least one surrounding pixel circuit 21a, so as to prevent the part of light from being irradiated to the active layer of the driving transistor T4 in the at least one surrounding pixel circuit 21a. In this way, it may be possible to retard the drift of the threshold voltage of the driving transistor T4, retard the reduction of the driving current of the surrounding pixel circuit 21a, retard the decrease in the display brightness, and further retard the "progressive dark circle" phenomenon of the display panel 100 and the display apparatus 1000.

Figure 8B:
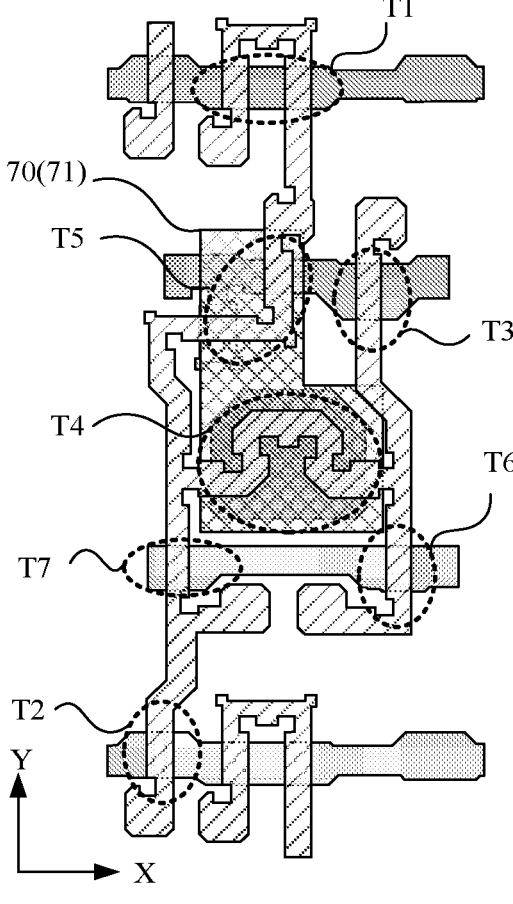
FIG. 8b is a top view of some other film layers in a display panel, in accordance with some embodiments of the present disclosure.

In some embodiments, as shown in FIG. 8b, the surrounding pixel circuit 21a further includes the compensation transistor T5 coupled to the driving transistor T4.

In some examples, as shown in FIG. 8b, an orthographic projection of an active layer of the compensation transistor T5 on the base substrate 10 is located within the orthographic projection of the light-shielding pattern 71 on the base substrate 10. In this case, a part of the surrounding pixel circuit 21a refers to, for example, the active layer of the driving transistor T4 and the active layer of the compensating transistor T5.

For example, the orthographic projection of the active layer of the compensation transistor T5 on the base substrate 10 is located within the boundary line of the orthographic projection of the light-shielding pattern on the base substrate 10. Alternatively, a boundary line of the orthographic projection of the active layer of the compensation transistor T5 on the base substrate 10 at least partially coincides with the boundary line of the orthographic projection of the light-shielding pattern on the base substrate 10.

With the above provision manner, after the external light and the light emitted by the light-emitting devices undergo a string of refraction and/or reflection and are incident onto the interface between the back film 60 and air, part of the light may be totally reflected at the interface and then directed towards the interior of the display panel 100. This part of light undergoing the total reflection will be blocked by the light-shielding pattern 71 in the light-shielding layer 70 before entering the active layers of the driving transistor T4 and the compensation transistor T5 in the at least one surrounding pixel circuit 21*a*, so as to prevent the part of light from being irradiated to the active layers of the driving transistor T4 and the compensation transistor T5 in one or more surrounding pixel circuits 21*a*. In this way, it may be possible to retard the drifts of the threshold voltages of the driving transistor T4 and the compensation transistor T5, retard the reduction of the driving current of the surrounding pixel circuit 21*a*, retard the decrease in the display brightness, and further retard the "progressive dark circle" phenomenon of the display panel 100 and the display apparatus 1000.

For example, the active layers of the driving transistor T4 and the compensation transistor T5 in the same surrounding pixel circuit 21*a* may correspond to the same light-shielding pattern 71. That is, the active layers of the driving transistor T4 and the compensation transistor T5 in the same surrounding pixel circuit 21*a* are located within the orthographic projection of the light-shielding pattern 71 on the base substrate 10.

It will be noted that, in an implementation, the threshold voltages of the driving transistor and the compensation transistor in the pixel circuit drift due to the action of light, so that in the data writing and compensation phase, the data signal transmitted by the compensation transistor cannot achieve effective compensation for the threshold voltage of the driving transistor. For example, the voltage of the fourth node after compensation is excessively high, so that the driving transistor cannot fully turned on, and the driving current generated by the driving transistor is relatively small in the light-emitting stage, thereby causing the decrease in the display brightness of the light-emitting device, and further causing the "progressive dark circle" phenomenon of the display panel and the display apparatus.

In the above arrangement in present disclosure, the orthographic projections of the active layers of the driving transistor T4 and the compensation transistor T5 on the base substrate 10 are both located within the orthographic projection of the light-shielding pattern 71 on the base substrate 10. Therefore, after the external light and the light emitted by the light-emitting devices undergo a string of refraction and/or reflection and are incident onto the interface between the back film 60 and air, part of the light may be totally reflected at the interface and then directed towards the interior of the display panel 100. This part of light undergoing the total reflection will be blocked by the light-shielding pattern 71 in the light-shielding layer 70 before entering the active layers of the driving transistor T4 and the compensation transistor T5 in the at least one surrounding pixel circuit 21*a*, so as to prevent the part of light from being irradiated to the active layers of the driving transistor T4 and the compensation transistor T5 in one or more surrounding pixel circuits 21*a*. In this way, it may be possible to retard the drifts of the threshold voltages of the driving transistor T4 and the compensation transistor T5, so that the compensation transistor T5 may achieve effective compensation for the threshold voltage of the driving transistor T4, thereby retarding the reduction of the driving current of the surrounding pixel circuit 21*a*, retard the decrease in the display brightness, and further retard the "progressive dark circle" phenomenon of the display panel 100 and the display apparatus 1000.

It can be understood that, the structure of the light-shielding layer 70 varies, and the arrangement of the light-shielding pattern 71 in the light-shielding layer 70 varies, which may be set according to actual needs.

In some embodiments, as shown in FIG. 11, the plurality of light-shielding patterns 71 in the light-shielding layer may be separate and not connected to each other.

For example, the plurality of light-shielding patterns 71 in the light-shielding layer 70 may all be unconnected light-shielding patterns 71.

Figure 13:
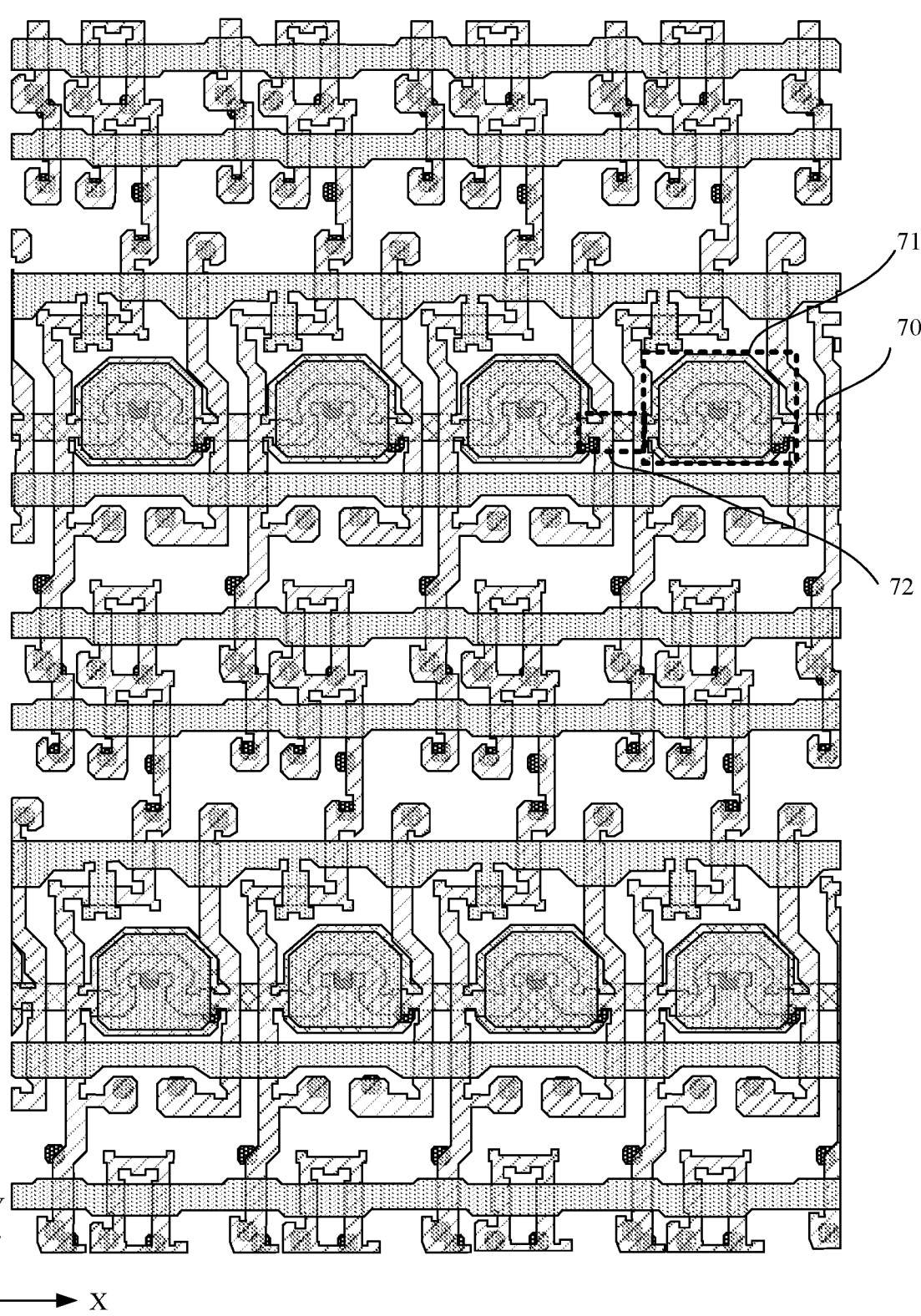
FIG. 13 is a top view of yet some other film layers in a display panel, in accordance with some embodiments of the present disclosure.

In some other embodiments, as shown in FIG. 13, the light-shielding layer 70 further includes at least one connection pattern 72. Two adjacent light-shielding patterns 71 are connected by a connection pattern 72.

For example, the connection pattern 72 may be a striped pattern extending in a certain direction, and connects two adjacent light-shielding patterns 71 together.

The connecting manner of light-shielding patterns 71 in the light-shielding layer 70 varies, which may be set according to the actual situation, and is not limited in the present disclosure.

For example, in all of the plurality of light-shielding patterns 71 in the light-shielding layer 70, every two adjacent light-shielding patterns 71 may be connected to each other, alternatively, multiple light-shielding patterns 71 adjacent in sequence may be connected. Alternatively, in all of the plurality of light-shielding patterns 71 in the light-shielding layer 70, adjacent light-shielding patterns 71 in some of the light-shielding patterns 71 may be unconnected, while adjacent light-shielding patterns 71 in the rest of the light-shielding patterns may be connected.

In some examples, in some surrounding pixel circuits 21*a* located on the same side of the secondary display region A2, light-shielding patterns 71 corresponding to at least two surrounding pixel circuits 21*a* adjacent in the first direction X are connected.

For example, as shown in FIG. 13, an outer contour of the connected light-shielding patterns 71 may extend in the first direction X, and all the connected light-shielding patterns 71 may be arranged in multiple rows.

For example, in some surrounding pixel circuits 21*a* located on opposite sides of the secondary display region A2, light-shielding patterns 71 corresponding to two adjacent surrounding pixel circuits 21*a* in the first direction X are not connected. That is, in the same row of light-shielding patterns, the two adjacent light-shielding patterns 71 located on the opposite sides of the secondary display region A2 will not be connected through the secondary display region A2. In this way, it may avoid the adverse effect of the light-shielding patterns 71 on the light transmittance of the secondary display region A2, and avoid reducing the light transmittance of the secondary display region A2. Thus, the optical element 50 located in the secondary display region A2 may collect sufficient light, thereby enabling the display panel 100 and display apparatus 1000 to achieve good photographing effect.

In some other examples, in some surrounding pixel circuits 21*a* located on the same side of the secondary display region A2, light-shielding patterns 71 corresponding to at least two surrounding pixel circuits 21*a* adjacent in the second direction Y are connected.

Figure 12B:
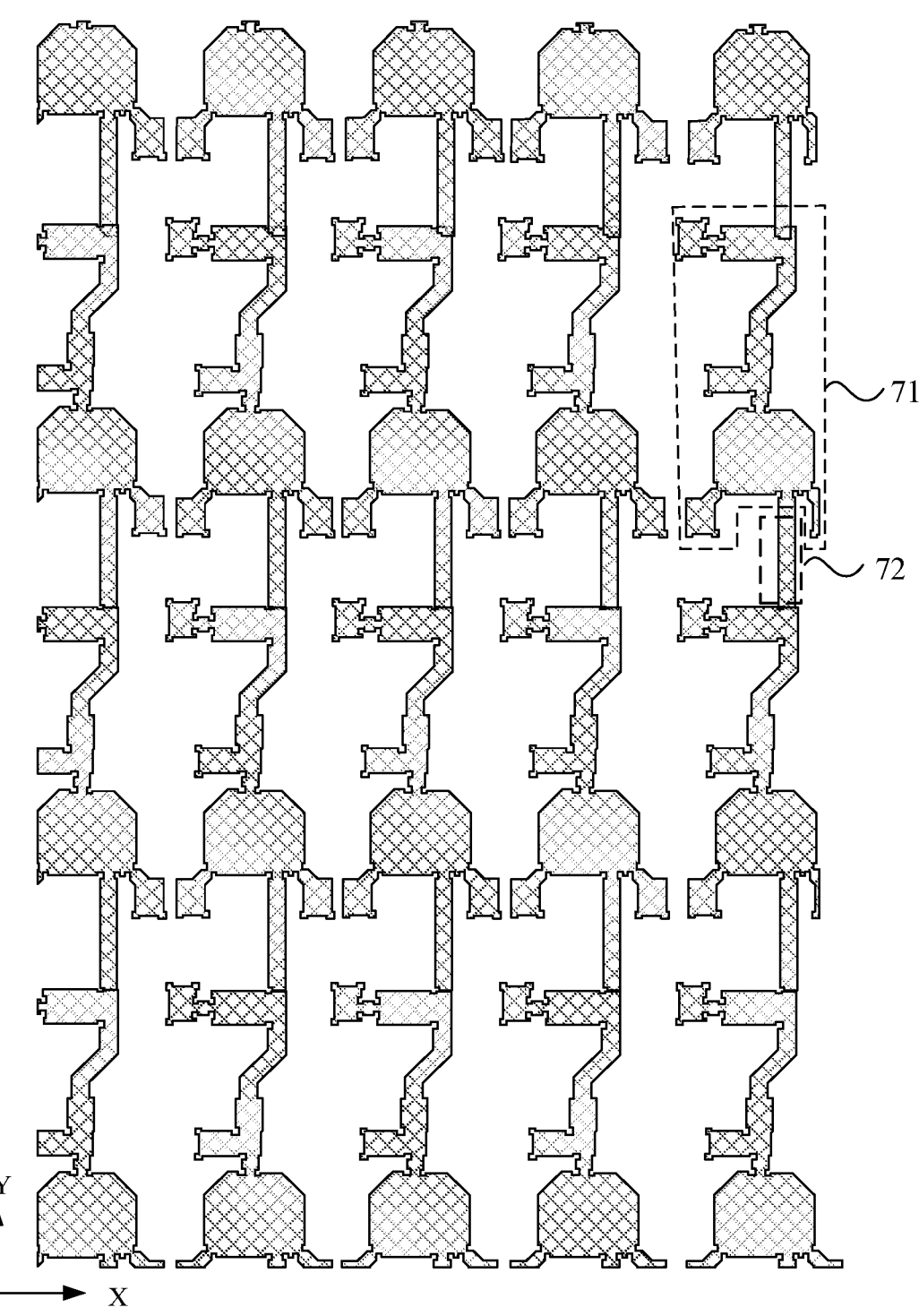
FIG. 12b is a top view of yet some other film layers in a display panel, in accordance with some embodiments of the present disclosure.

For example, as shown in FIG. 12*b*, an outer contour of the connected light-shielding patterns 71 may extend in the second direction Y, and all the connected light-shielding patterns 71 may be arranged in multiple columns.

For example, in some surrounding pixel circuits 21*a* located on opposite sides of the secondary display region A2, light-shielding patterns 71 corresponding to two adjacent surrounding pixel circuits 21$a$ in the second direction Y are not connected. That is, in the same column of light-shielding patterns, the two adjacent light-shielding patterns 71 located on the opposite sides of the secondary display region A2 will not be connected through the secondary display region A2 in the second direction Y. In this way, it may avoid the effect on the light transmittance of the secondary display region A2, and avoid reducing the light transmittance of the secondary display region A2. Thus, the optical element 50 located in the secondary display region A2 may collect sufficient light, thereby enabling the display panel 100 and display apparatus 1000 to achieve good photographing effect.

Figure 14:
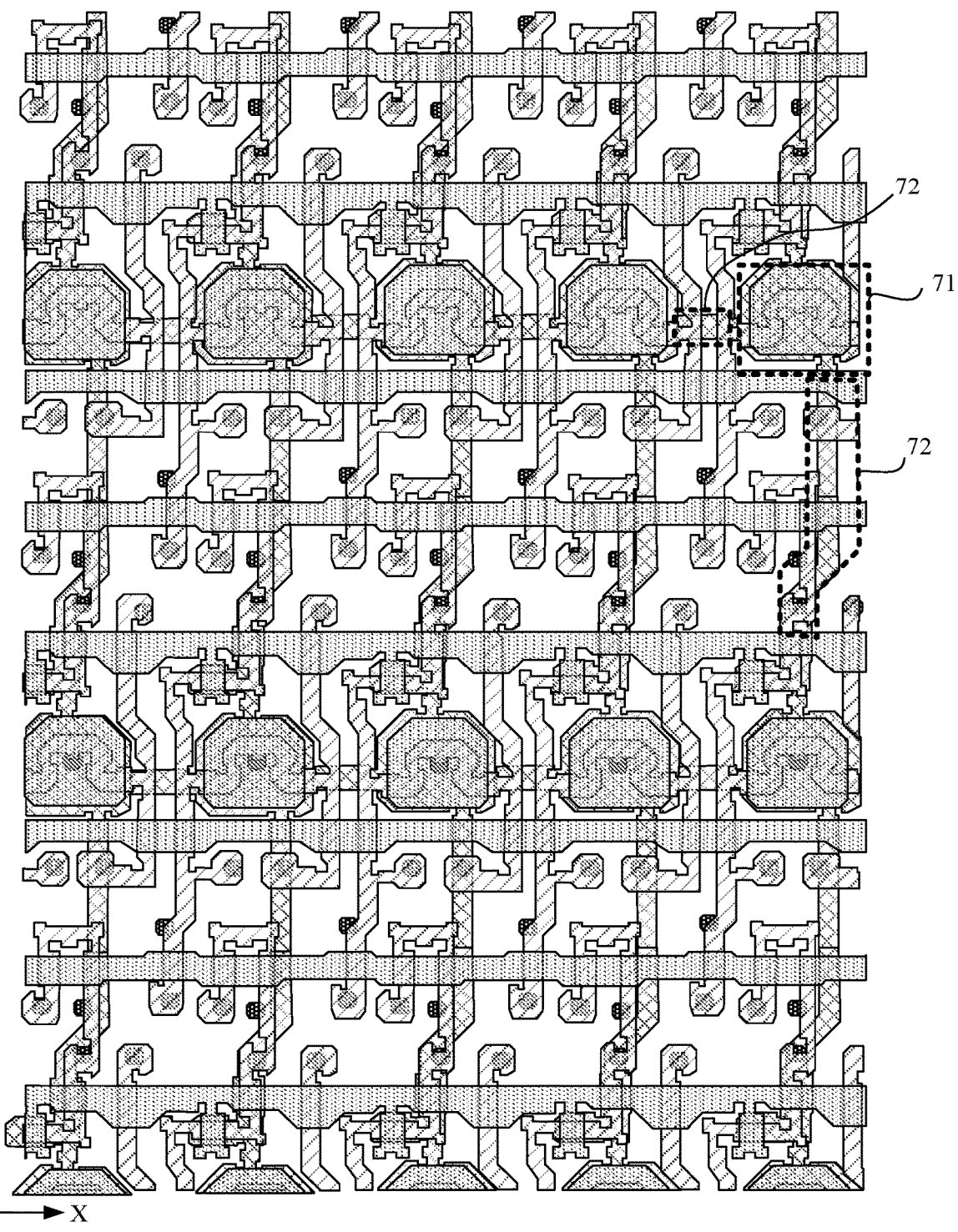
FIG. 14 is a top view of yet some other film layers in a display panel, in accordance with some embodiments of the present disclosure.
Figure 15:
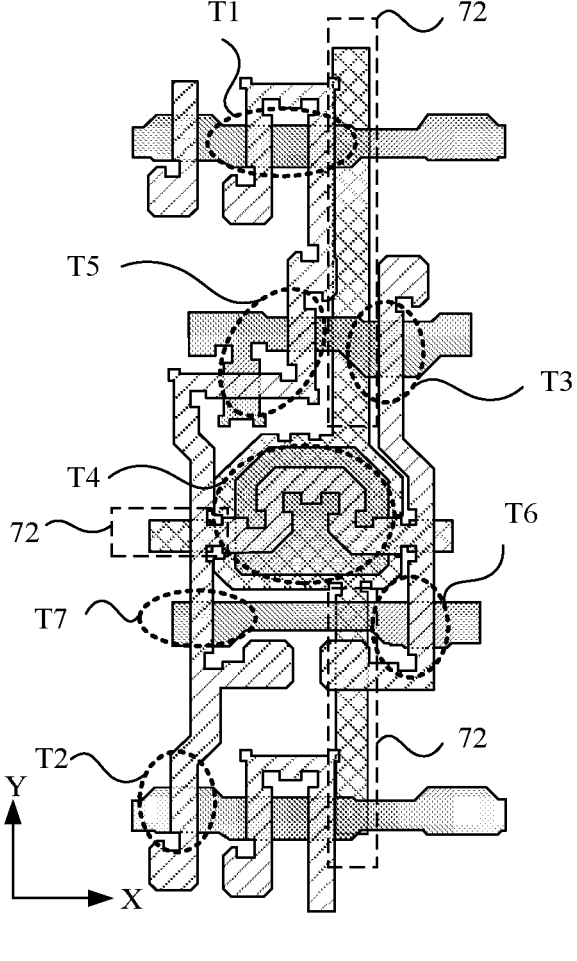
FIG. 15 is a top view of yet some other film layers in a display panel, in accordance with some embodiments of the present disclosure.

In yet some other examples, as shown in FIGS. 13 and 14, at least four light-shielding patterns 71 in the plurality of light-shielding patterns 71 included in the light-shielding layer 70 may be connected by the connection patterns 72 in the first direction X, and at least four light-shielding patterns 71 in the plurality of light-shielding patterns 71 included in the light-shielding layer 70 may be connected by the connection patterns 72 in the second direction Y.

Figures 16, 17:
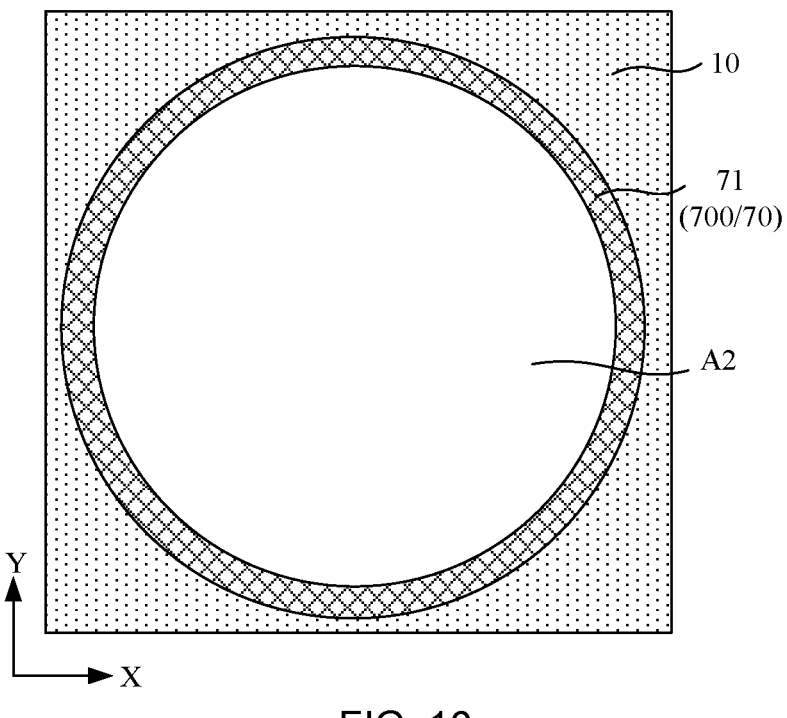
FIG. 16 is a structural diagram of a light-shielding layer and a base substrate, in accordance with some embodiments of the present disclosure.
FIG. 17 is a structural diagram of another light-shielding layer and a base substrate, in accordance with some embodiments of the present disclosure.

In yet some other examples, as shown in FIG. 16, the plurality of light-shielding patterns 71 included in the light-shielding layer 70 are connected to be of an integrated structure. The light-shielding layer 70 surrounds the secondary display region A2.

For example, "the integrated structure" means that the plurality of connected light-shielding patterns are arranged in the same layer, and the plurality of light-shielding patterns are continuous and not separated.

For example, in the plurality of light-shielding patterns 71, some connected light-shielding patterns 71 may be arranged sequentially in the first direction X; and/or some connected light-shielding patterns 71 may extend in the second direction Y; and/or the remaining connected light-shielding patterns 71 may extend in any direction except the first direction and the second direction. An overall outline formed by all connected light-shielding patterns 71 may surround at least part of the secondary display region A2.

Optionally, the light-shielding pattern 71 in the light-shielding layer 70 may be an integral pattern, which is provided corresponding to the surrounding pixel circuits 21$a$ in the display panel 100. The integral pattern refers to that the pattern has no hollow structure in other regions except for in the secondary display region A2. Thus, the manufacturing process of the light-shielding layer 70 in the display panel 100 may be simplified, and the shielding effect of the light-shielding layer 70 on the light incident on the pixel circuit layer 20 may be improved.

Optionally, the light-shielding pattern 71 in the light-shielding layer 70 may be an integral pattern. In the integral pattern, except for the hollowed-out region in the secondary display region A2, other regions may also have a hollowed-out structure. Only some structures, such as a region where the active layer is located, in the pixel circuit 21 are blocked. Thus, the usage amount of the material of the light-shielding layer 70 may be reduced.

In yet some other examples, as shown in FIG. 17, the light-shielding layer 70 includes at least two light-shielding rings 700 arranged concentrically. The light-shielding ring includes multiple connected light-shielding patterns, and the light-shielding ring surrounds at least part of the secondary display region A2.

For example, centers of a plurality of light-shielding rings may coincide with the center of the secondary display region A2.

For example, the light-shielding ring may have a closed figure, such as a circle, an ellipse, a rectangle, and the like. In this case, the light-shielding ring may surround the whole secondary display region A2.

For example, the light-shielding ring may have a non-closed figure, such as a part of a circle or a rectangle. In this case, the light-shielding ring may be located on a side of part of the secondary display region A2.

For convenience of description, the embodiments of the present disclosure will be illustrated by considering an example where the light-shielding ring is a closed circle.

For example, the light-shielding layer 70 may include two or more light-shielding rings arranged concentrically.

With the above provision manner, after the external light and the light emitted by the light-emitting devices undergo a string of refraction and/or reflection and are incident onto the interface between the back film 60 and air, part of the light exits after being totally reflected at the interface. The part of the light exiting after total reflection is blocked by the light-shielding ring in the light-shielding layer 70, so as to prevent the part of the light from being irradiated to at least part of the surrounding pixel circuit 21$a$ corresponding to the light-shielding ring, thereby retarding the drift of the threshold voltage of the surrounding pixel circuit 21$a$, retarding the reduction of the driving current of the surrounding pixel circuit 21$a$, retarding the decrease in the display brightness of the region around the secondary display region A2, and further retarding the "progressive dark circle" phenomenon of the display panel 100 and the display apparatus 1000.

In addition, as mentioned above, in the case where the refractive index of the material of the back film 60 is 1.45, and the distance between the pixel circuit layer 20 and the interface between the back film and air is 11 μm, in the two or more light-shielding rings arranged concentrically included in the light-shielding layer 70, a difference between an outer diameter of the largest light-shielding ring and an inner diameter of the smallest light-shielding ring is at least (96×2) μm, that is, 192 μm. Thus, the illuminated pixel circuit 21 may be blocked, so as to avoid the effect of light on the threshold voltage of the pixel circuit, thereby retarding the reduction of the driving current of the pixel circuit, retarding the decrease in the display brightness of the region around the secondary display region A2, and further retarding the "progressive dark circle" phenomenon of the display panel 100 and the display apparatus 1000.

In some embodiments, as shown in FIGS. 5 and 6$a$, in the first direction X, at least six columns of surrounding pixel circuits 21$a$ are disposed on any side in opposite sides of the secondary display region A2; and in the second direction Y, at least three rows of surrounding pixel circuits 21$a$ are disposed on any side in opposite sides of the secondary display region A2.

For example, in the first direction X, six or eight columns of surrounding pixel circuits 21$a$ are provided on any side in the opposite sides of the secondary display region A2.

For example, in the second direction Y, three or five rows of surrounding pixel circuits 21$a$ are provided on any side in the opposite sides of the secondary display region A2.

It will be noted that, as mentioned above, in the case where the refractive index of the material of the back film 60 is 1.45, and the distance between the active layer in the pixel circuit layer 20 and the interface between the back film and air is 11 μm, after the external light and the light emitted by the light-emitting devices 31 undergo a string of refraction and/or reflection may be irradiated to a region within 96 μm from the boundary line of the secondary display region A2.

By considering an example of the pixel circuit with a dimension of 32 μm in the first direction X and a dimension of 16 μm in the second direction Y, the region within 96 μm from the boundary line of the secondary display region A2 corresponds to the size of six columns of pixel circuits 21 in the first direction X, and the size of three rows of pixel circuits 21 in the second direction Y.

The present disclosure adopts the above-mentioned provision manner. At least six columns of surrounding pixel circuits 21a are provided on any side in the opposite sides of the secondary display region A2 in the first direction X, and the light-shielding layer 70 may be provided corresponding to the region of the at least six columns of surrounding pixel circuits 21a, so that the light-shielding layer 70 blocks the corresponding at least six columns of surrounding pixel circuits 21a, so as to prevent the light incident on the interface between the back film 60 and air from being incident on the at least six columns of surrounding pixel circuits after total reflection, and further prevent the active layers of the transistors in the at least six columns of surrounding pixel circuits 21a from being illuminated. Therefore, it may avoid the drifts of the threshold voltages of the transistors in the at least six columns of surrounding pixel circuits 21a, and avoid the decrease in the display brightness of light-emitting devices 31 coupled to the at least six columns of surrounding pixel circuits 21a. At least three rows of surrounding pixel circuits 21a are provided on any side in the opposite sides of the secondary display region A2 in the second direction Y, and the light-shielding layer 70 may be provided corresponding to the region of the at least three rows of surrounding the pixel circuits 21a, so that the light-shielding layer 70 blocks the corresponding at least three rows of surrounding pixel circuits, so as to prevent the light incident on the interface between the back film 60 and air from being incident on the at least three rows of surrounding pixel circuits 21a after total reflection, and further prevent the active layers of the transistors in the at least three rows of surrounding pixel circuits 21a from being illuminated. Therefore, it may avoid the drifts of the threshold voltages of the transistors in the at least three rows of surrounding pixel circuits 21a, and avoid the decrease in the display brightness of light-emitting devices 31 coupled to the at least three rows of surrounding pixel circuits 21a. Further, it may avoid the "progressive dark circle" phenomenon of the display panel 100 and the display apparatus 1000.

Figure 18:
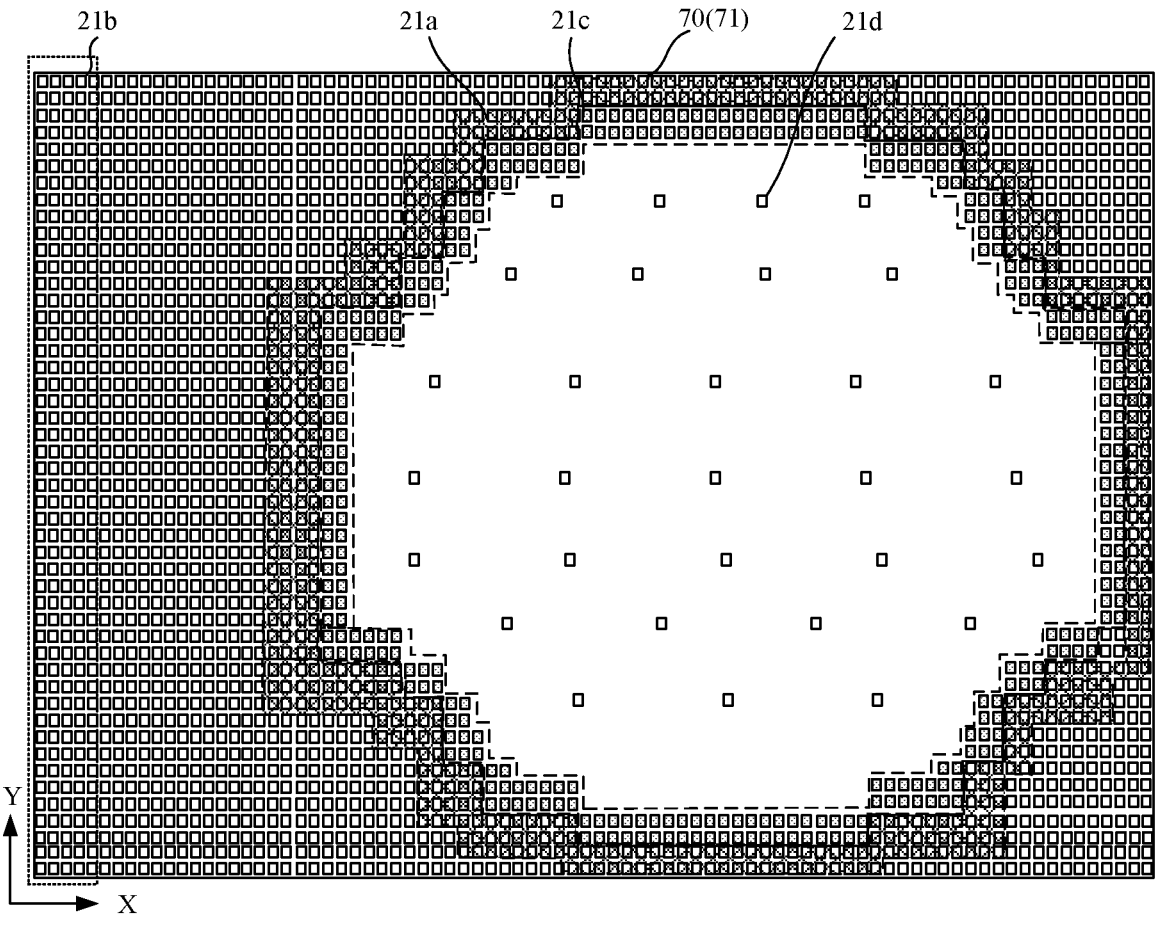
FIG. 18 is a structural diagram of a pixel circuit layer and a light-shielding layer, in accordance with some embodiments of the present disclosure.

In some embodiments, as shown in FIG. 18, the plurality of pixel circuits in the pixel circuit layer 20 further include a plurality of first pixel circuits 21b located in the main display region A1.

For example, the first pixel circuit 21b may be coupled to the first light-emitting device 31a located in the main display region A1, so as to provide a driving signal for the first light-emitting device 31a to drive the first light-emitting device 31a to emit light.

In some examples, as shown in FIG. 6a, the orthographic projections of the plurality of first pixel circuits 21b on the base substrate 10 at least partially overlap the orthographic projections of the plurality of first light-emitting devices 31a on the base substrate 10 respectively.

For example, the first pixel circuit 21b is provided opposite to the corresponding first light-emitting device 31a. For another example, the first pixel circuit 21b is provided partially opposite to the corresponding first light-emitting device 31a. That is, the first light-emitting device 31a is directly above or near directly above the first pixel circuit 21b.

In some examples, at least some surrounding pixel circuits 21a in the plurality of surrounding pixel circuits 21a are the first pixel circuits 21b. That is, at least some surrounding the pixel circuit 21a and light-emitting device 31 driven thereby are arranged opposite or partially opposite.

In some embodiments, the plurality of pixel circuits in the pixel circuit layer 20 further include a plurality of second pixel circuits 21d.

In some examples, as shown in FIG. 5, the plurality of second pixel circuits 21d are located in the main display region A1. The plurality of second pixel circuits 21d and the plurality of second light-emitting devices 31b are respectively coupled through conductive lines.

For example, the second pixel circuit 21d may be coupled to the second light-emitting device 31b located in the secondary display region A2, so as to provide a driving signal for the second light-emitting device 31b to drive the second light-emitting device 31b to emit light.

Here, there is a certain distance between a second pixel circuit 21d and a corresponding second light-emitting device 31b, and thus the second pixel circuit 21d needs to be connected to the corresponding second light-emitting device 31b through a conductive line.

For example, at least some surrounding pixel circuits 21a in the plurality of surrounding pixel circuits 21a are the second pixel circuits 21d. That is, at least some surrounding pixel circuits 21a and corresponding light-emitting devices 31 need to be connected respectively by conductive lines.

Figure 6B:
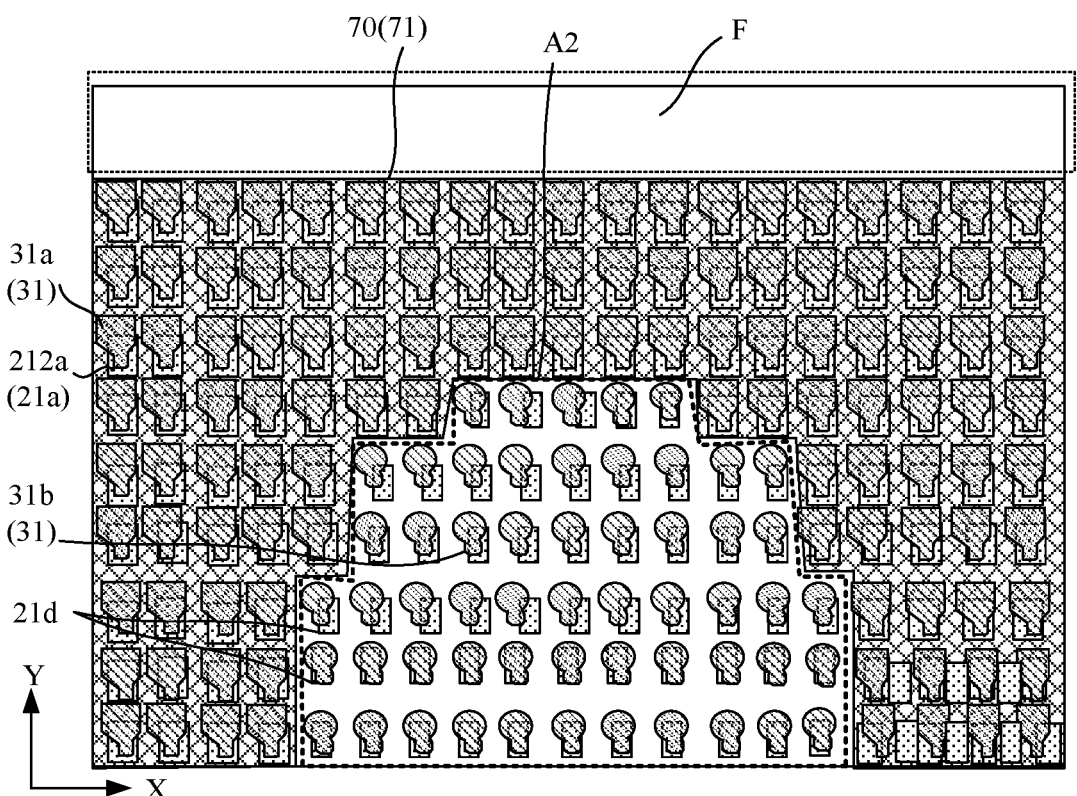
FIG. 6b is a partial structural diagram of yet another display panel, in accordance with some embodiments of the present disclosure.

In some other examples, as shown in FIG. 6b, the plurality of second pixel circuits 21d are located in the secondary display region A2.

For example, the arrangement density of the plurality of second pixel circuits 21d located in the secondary display region A2 is smaller than the arrangement density of the plurality of pixel circuits 21 located in the display region A.

For example, an area of a region occupied by the second pixel circuits 21d located in the secondary display region A2 in the display panel 100 is smaller than an area of a region occupied by the pixel circuits 21 located in the display region A in the display panel 100.

With the above provision manner, the light transmittance of the secondary display region A2 of the display panel 100 may be greater than the light transmittance of the main display region A1 of the display panel 100, so that the optical element 50 located in the secondary display region A2 may receive enough light, thereby achieving the normal operation of the optical element 50.

For example, the plurality of second pixel circuits 21d are respectively coupled to the plurality of second light-emitting devices 31b, so as to provide driving signals for the second light-emitting devices 31b to drive the second light-emitting devices 31b to emit light.

For example, the plurality of second pixel circuits 21d may only be located in a region proximate to the boundary of the secondary display region A2, and no second pixel circuit 21d is provided in the middle of the secondary display region A2, while the plurality of second light-emitting devices 31b may be uniformly distributed in the secondary display region A2.

Thus, the orthographic projections of the plurality of second pixel circuits 21d on the base substrate 10 and the orthographic projections of the plurality of second light-emitting devices 31b on the base substrate 10 are at least partially overlapped. In the plurality of second pixel circuits 21d, some second pixel circuits 21d are arranged opposite to the corresponding second light-emitting devices 31b, and the other second pixel circuits 21*d* are arranged partially opposite to the corresponding second light-emitting devices 31*b*.

In yet some other examples, as shown in FIG. 6*a*, the plurality of second pixel circuits 21*d* are located in the frame region F.

For example, the plurality of second pixel circuits 21*d* are respectively coupled to the plurality of second light-emitting devices 31*b*, so as to provide driving signals for the second light-emitting devices 31*b* to drive the second light-emitting devices 31*b* to emit light.

For example, since the second pixel circuit 21*d* is located in the frame region F, and the second light-emitting device 31*b* is located in the secondary display region A2, there is a certain distance between the second pixel circuit 21*d* and the corresponding second light-emitting device 31*b*, and the second pixel circuit 21*d* is coupled to the corresponding second light-emitting device 31*b* through a conductive line.

In some embodiments, as shown in FIGS. 18, the pixel circuit layer 20 further includes a plurality of redundant pixel circuits 21*c*.

For example, the plurality of redundant pixel circuits 21*c* are electrically insulated from signal lines (e.g., the first scanning signal lines Gate10, the second scanning signal lines Gate20, the data signal lines Data, and the enable signal lines EM) and the anode layers of the light-emitting devices 31. That is, none of the plurality of redundant pixel circuits 21*c* is coupled to the signal lines (e.g., the first scanning signal lines Gate10, the second scanning signal lines Gate20, the data signal lines Data, and the enable signal lines EM), and none of the plurality of redundant pixel circuits 21*c* is coupled to an anode layer of a light-emitting device 31.

With the above provision manner, the plurality of redundant pixel circuits 21*c* are provided, so as to improve the uniformity of the surrounding pixel circuits 21*a*, and avoid the problem of the drifts of the threshold voltages of the surrounding pixel circuits 21*a*. Therefore, it may solve the problem of abnormal display of the light-emitting device 31 in the light-emitting devices coupled to the surrounding pixel circuit 21*a* proximate the boundary of secondary display region A2.

For example, as shown in FIG. 18, the plurality of redundant pixel circuits 21*c* are located in the main display region A1 and surround at least part of the secondary display region A2.

For example, the plurality of redundant pixel circuits 21*c* may surround a part of the secondary display region A2. Alternatively, the plurality of redundant pixel circuits 21*c* may surround a whole of the secondary display region A2.

For example, the plurality of redundant pixel circuits 21*c* are closer to the secondary display region A2 than the surrounding pixel circuits 21*a*.

With the above provision manner, after the external light and the light emitted by the light-emitting devices are incident on the interface between the back film 60 and air, part of the light exits after total reflection at the interface. The part of the light exiting after total reflection is blocked by the redundant pixel circuits 21*c*, so as to prevent the part of the light from passing through the pixel circuit layer 20 and exiting from the light-exiting side of the display panel 100, and further avoid abnormal display of the display panel 100 and the display apparatus 1000, thereby improving the display effect of the display panel 100 and the display apparatus 1000.

In some embodiments, as shown in FIG. 18, in a case where the pixel circuit layer 20 includes the plurality of surrounding pixel circuits 21*a* and the plurality of redundant pixel circuits 21*c*, the plurality of surrounding pixel circuits 21*a* are arranged in a plurality of columns in the first direction X and in a plurality of rows in the second direction Y, and the plurality of redundant pixel circuits 21*c* are arranged in at least one column in the first direction X and in at least one row in the second direction Y.

In some examples, the plurality of redundant pixel circuits 21*c* are arranged in one or more columns in the first direction X.

In some examples, the plurality of redundant pixel circuits 21*c* are arranged in one or more rows in the second direction Y.

With the above provision manner, during manufacturing the pixel circuit layer 20, the redundant pixel circuits 21*c* and the surrounding pixel circuits 21*a* may be manufactured together, and the redundant pixel circuits 21*c* are not coupled to the signal lines and the light-emitting devices, thereby simplifying the manufacturing process of the surrounding pixel circuits 21*a* and the redundant pixel circuits 21*c* in the pixel circuit layer 20.

In some examples, in the first direction X, a sum of the number of columns of the surrounding pixel circuits 21*a* and the number of columns of the redundant pixel circuits 21*c* arranged on any side in the opposite sides of the secondary display region A2 is greater than or equal to 6.

For example, in the first direction X, the number of the columns of the redundant pixel circuits 21*c* arranged on any side in the opposite sides of the secondary display region A2 may be less than or equal to 5.

For example, in a case where the number of the columns of the redundant pixel circuits 21*c* arranged on any side in the opposite sides of the secondary display region A2 in the first direction X is 2, the number of the columns of the surrounding pixel circuits 21*a* may be greater than or equal to 4.

For another example, in a case where the number of the columns of the redundant pixel circuits 21*c* arranged on any side in the opposite sides of the secondary display region A2 in the first direction X is 5, the number of the columns of the surrounding pixel circuits 21*a* may be greater than or equal to 1.

In some examples, in the second direction Y, a sum of the number of the rows of the surrounding pixel circuits 21*a* and the number of the rows of the redundant pixel circuits 21*c* arranged on any side in the opposite sides of the secondary display region A2 is greater than or equal to 3.

For example, in the second direction Y, the number of the rows of the redundant pixel circuits 21*c* arranged on any side in the opposite sides of the secondary display region A2 may be less than or equal to 2.

For example, in a case where the number of the rows of the redundant pixel circuits 21*c* arranged on any side in the opposite sides of the secondary display region A2 in the second direction Y is 2, the number of the rows of the surrounding pixel circuits 21*a* may be greater than or equal to 1.

For another example, in a case where the number of the rows of the redundant pixel circuits 21*c* arranged on any side in the opposite sides of the secondary display region A2 in the second direction Y is 1, the number of the rows of the surrounding pixel circuits 21*a* may be greater than or equal to 2.

With the above provision manner, the blocking effect of the light-shielding layer on the surrounding pixel circuits 21*a* and the improvement effect on the "progressive dark circle" may be ensured. In addition, when the external light and light emitted by the second light-emitting devices 31*b* in the secondary display region A2 reach the pixel circuit layer 20 in the display panel 100 after a string of refraction and/or reflection, the active layers of the redundant pixel circuits 21*c* will be irradiated by part of the light. Since the redundant pixel circuits 21*c* are not connected to the light-emitting devices 31, the luminance of the light-emitting devices will not be affected. Thus, the light-shielding layer 70 may be provided only in a region corresponding to the surrounding pixel circuits 21*a*, rather than in a region corresponding to the redundant pixel circuits 21*c*, thereby reducing the usage amount of the material of the light-shielding layer 70.

In some embodiments, the display panel 100 further includes a semiconductor layer Poly, a first conductive layer Gate1, a second conductive layer Gate2, an interlayer dielectric layer ILD, a third conductive layer SD1, a first planarization layer PLN1, a fourth conductive layer SD2, a second planarization layer PLN2, an anode layer AND and a pixel defining layer PDL that are stacked in sequence on a side of the light-shielding layer 70 away from the base substrate 10.

For example, the pixel circuit layer 20 includes the semiconductor layer Poly, the first conductive layer Gate1, the second conductive layer Gate2, the interlayer dielectric layer ILD, the third conductive layer SD1, the first planarization layer PLN1 and the fourth conductive layer SD2.

Figure 19:
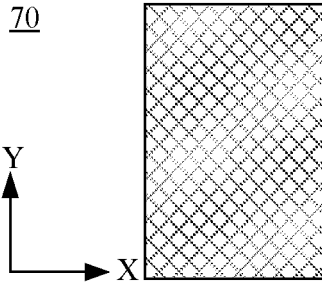
FIG. 19 is a top view showing a structure of a light-shielding layer in a display panel, in accordance with some embodiments of the present disclosure.
Figure 20A:
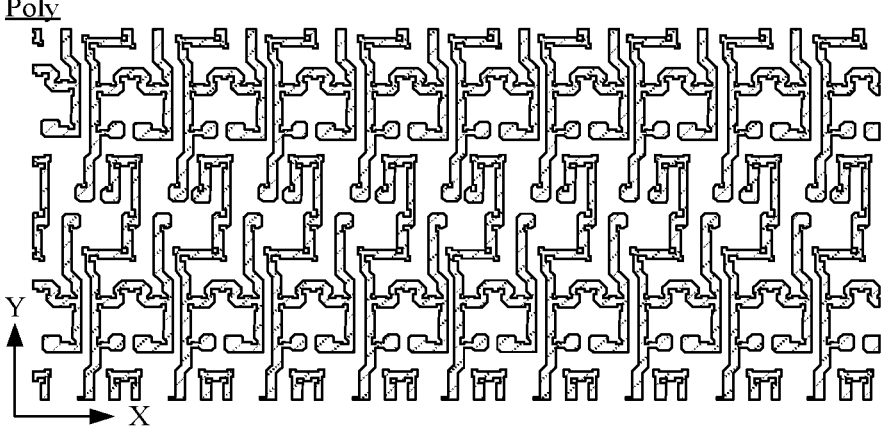
FIG. 20a is a top view of yet some other film layers in a display panel, in accordance with some embodiments of the present disclosure.
Figure 20B:
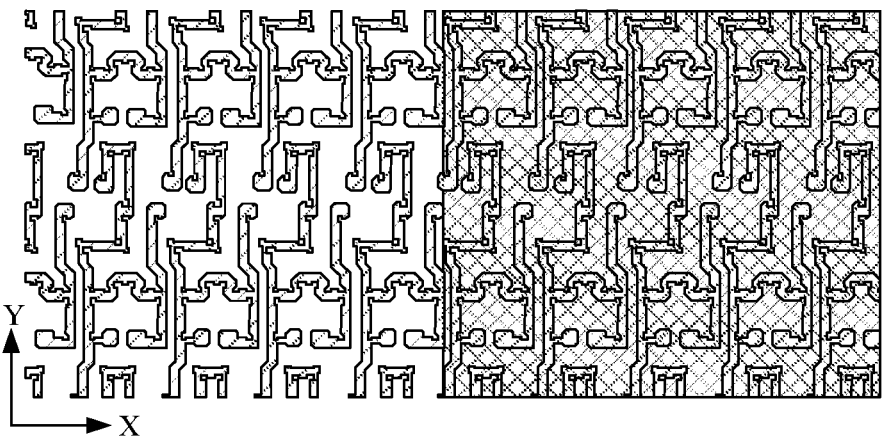
FIG. 20*b* is a top view of yet some other film layers in a display panel, in accordance with some embodiments of the present disclosure.
Figure 21:
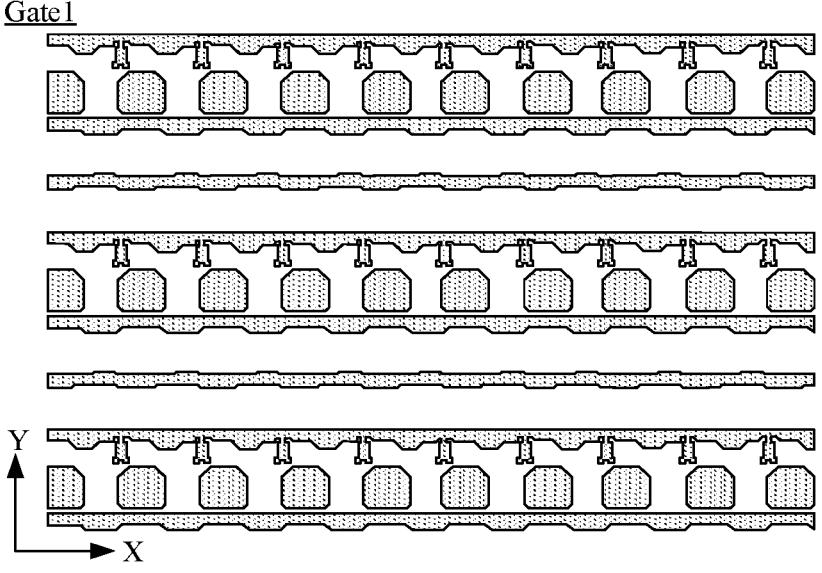
FIG. 21 is a top view of yet some other film layers in a display panel, in accordance with some embodiments of the present disclosure.
Figure 22:
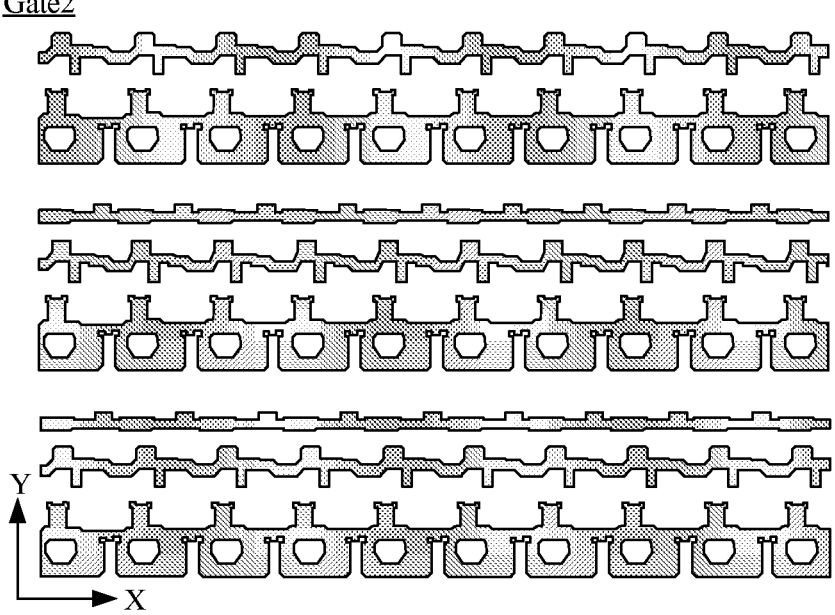
FIG. 22 is a top view of yet some other film layers in a display panel, in accordance with some embodiments of the present disclosure.
Figure 23:
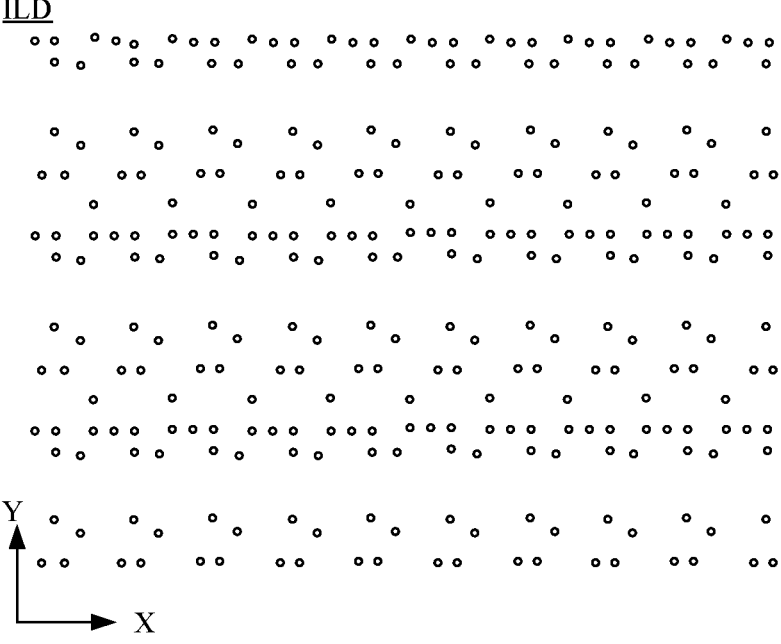
FIG. 23 is a top view of yet some other film layers in a display panel, in accordance with some embodiments of the present disclosure.
Figure 24:
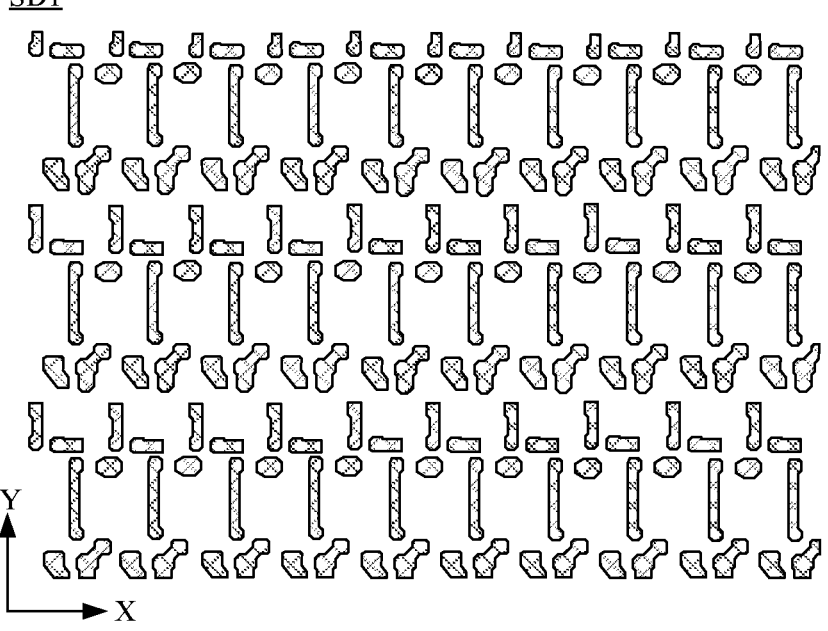
FIG. 24 is a top view of yet some other film layers in a display panel, in accordance with some embodiments of the present disclosure.
Figure 25:
FIG. 25 is a top view of yet some other film layers in a display panel, in accordance with some embodiments of the present disclosure.
Figure 26:
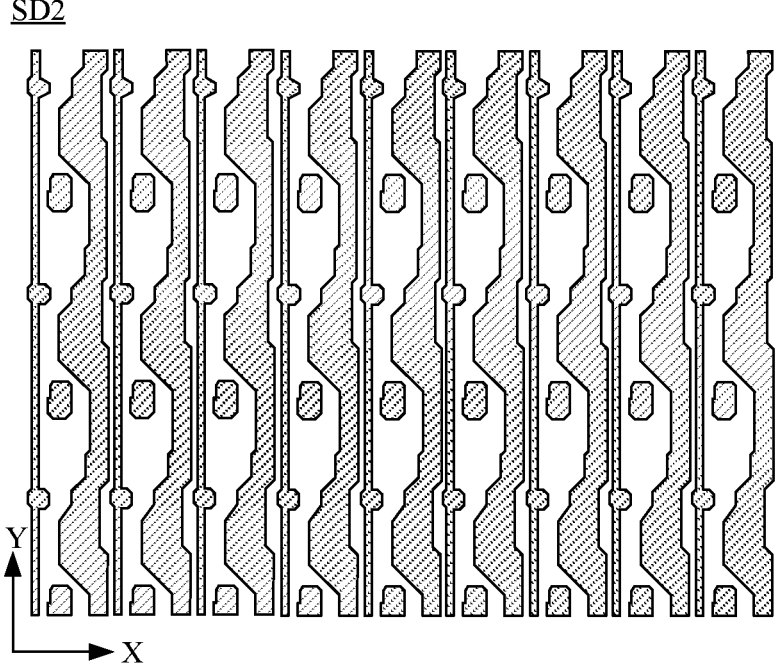
FIG. 26 is a top view of yet some other film layers in a display panel, in accordance with some embodiments of the present disclosure.
Figure 27:
FIG. 27 is a top view of yet some other film layers in a display panel, in accordance with some embodiments of the present disclosure.
Figure 27:
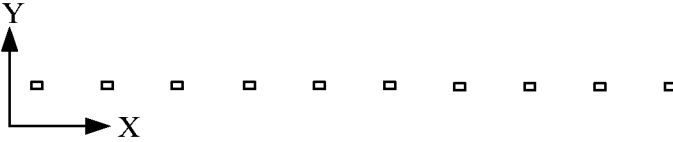
Figure 28:
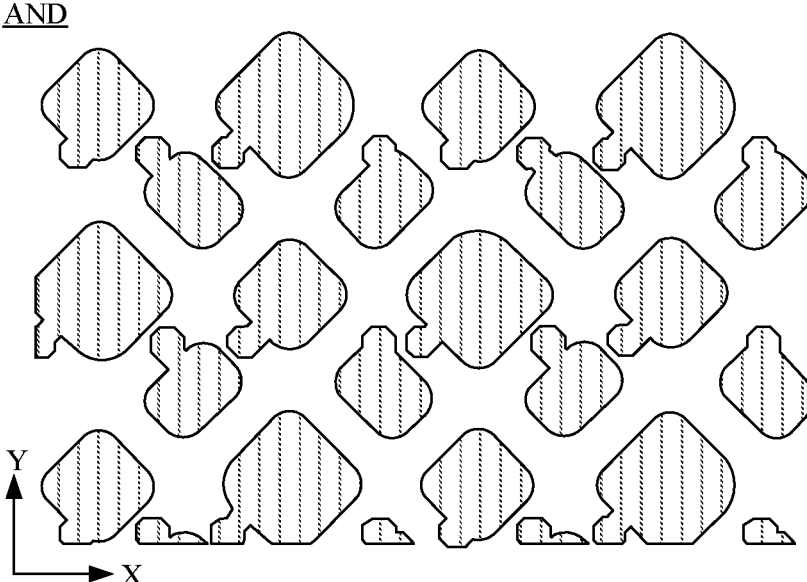
FIG. 28 is a top view of yet some other film layers in a display panel, in accordance with some embodiments of the present disclosure.
Figure 29:
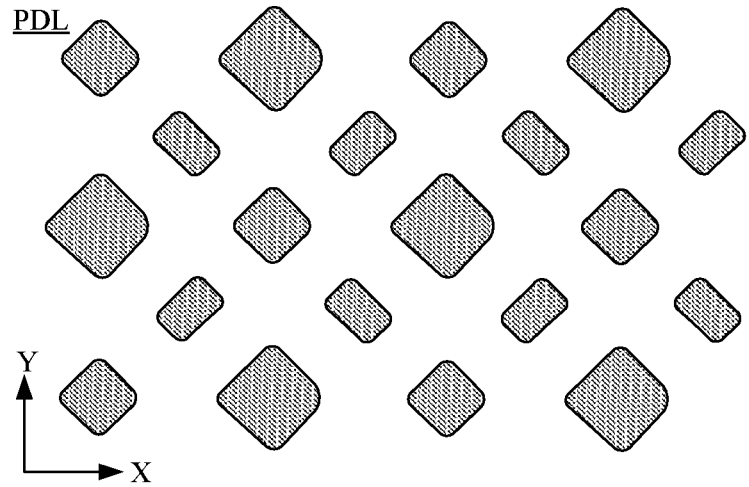
FIG. 29 is a top view of yet some other film layers in a display panel, in accordance with some embodiments of the present disclosure.

FIG. 19 schematically shows a top view of a structure of the light-shielding layer 70. FIG. 20*a* schematically shows a top view of a structure of the semiconductor layer Poly. FIG. 20*b* schematically shows a top view of a stack structure of the light-shielding layer 70 and the semiconductor layer Poly. FIG. 21 schematically shows a top view of a structure of the first conductive layer Gate1. FIG. 22 schematically shows a top view of a structure of the second conductive layer Gate2. FIG. 23 schematically shows a top view of a structure of the interlayer dielectric layer ILD. FIG. 24 schematically shows a top view of a structure of the third conductive layer SD1. FIG. 25 schematically shows a top view of a structure of the first planarization layer PLN1. FIG. 26 schematically shows a top view of a structure of the fourth conductive layer SD2. FIG. 27 schematically shows a top view of a structure of the second planarization layer PLN2. FIG. 28 schematically shows a top view of a structure of the anode layer AND. FIG. 29 schematically shows a top view of a structure of the pixel defining layer PDL.

For example, the interlayer dielectric layer ILD, the first planarization layer PLN1, and the second planarization layer PLN2 are generally made of transparent materials. Therefore, FIG. 23 only shows positions of via holes in the interlayer dielectric layer ILD, FIG. 25 only shows positions of via holes in the first planarization layer PLN1, and FIG. 27 only shows positions of via holes in the second planarization layer PLN2.

For example, a first gate insulating layer may be provided between the semiconductor layer Poly and the first conductive layer Gate1, and a second gate insulating layer may be provided between the first conductive layer Gate1 and the second conductive layer Gate2.

For example, the interlayer dielectric layer ILD, the first planarization layer PLN1, the second planarization layer PLN2, the first gate insulating layer and the second gate insulating layer each may be made of an insulating material, such as silicon oxide, silicon nitride, silicon oxynitride, and the like.

For example, a material of the semiconductor layer Poly includes amorphous silicon, monocrystalline silicon, polycrystalline silicon, or a metal oxide semiconductor material.

For example, the first conductive layer Gate1, the second conductive layer Gate2, the third conductive layer SD1 and the fourth conductive layer SD2 are each made of a conductive material. For example, the materials of the first conductive layer Gate1 and the second conductive layer Gate2 may be the same, and the materials of the third conductive layer SD1 and the fourth conductive layer SD2 may be the same.

For example, the first conductive layer Gate1, the second conductive layer Gate2, the third conductive layer SD1 or the fourth conductive layer SD2 may be made of a metal material, such as Al (aluminum), Ag (silver), Cu (copper), Cr (chromium), or the like.

It will be noted that an orthographic projection of the semiconductor layer Poly on the base substrate overlaps with an orthographic projection of the first conductive layer Gate1 on the base substrate. After the first conductive layer Gate1 is formed on a side of the semiconductor layer Poly away from the base substrate, the first conductive layer Gate1 may be used as a mask to perform doping treatment on the semiconductor layer Poly, so that a portion of the semiconductor layer Poly covered by the first conductive layer Gate1 constitutes an active pattern of each transistor, and a portion of the semiconductor layer Poly not covered by the first conductive layer Gate1 constitutes a conductor, which may serve as a first electrode or a second electrode of each transistor. The overlapping portion of the first conductive layer Gate1 and the semiconductor layer Poly constitutes a gate pattern (i.e., a gate) of each transistor.

Figure 9B:
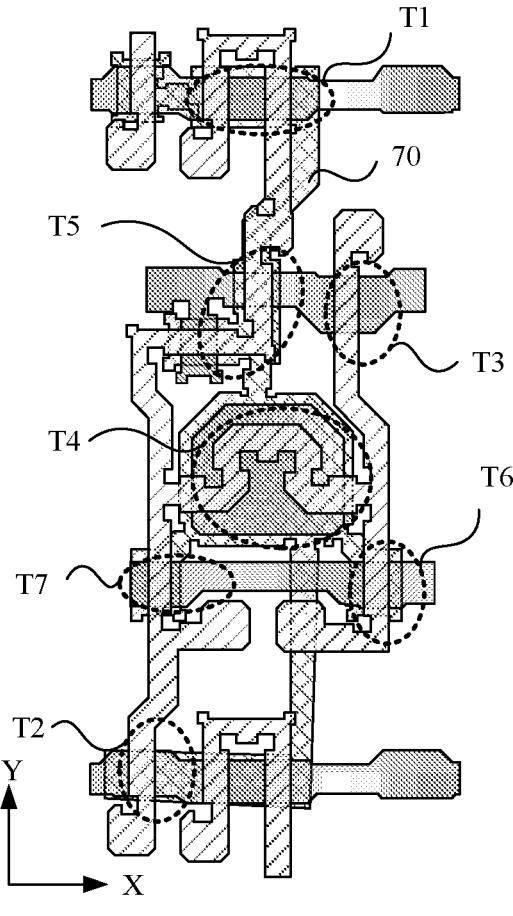
FIG. 9b is a top view of yet some other film layers in a display panel, in accordance with some embodiments of the present disclosure.

For example, the relative positional relationship between transistors and storage capacitors included in the pixel circuit 21 is shown in FIG. 9*b*. In the first direction X, the compensation transistor T5 and the switch transistor T3 are arranged in a row, and the first light-emitting control transistor T6 and the second light-emitting control transistor T7 are arranged in a row. In the first direction X, the driving transistor T4 is located between the second light-emitting control transistor T7 and the first light-emitting control transistor T6. In the second direction Y, the driving transistor T4 is located between the switching transistor T3 and the first light-emitting control transistor T6. In the first direction X, the compensation transistor T5 is located between the second reset transistor T2 and the switching transistor T3. In the second direction Y, the second reset transistor T2 is located on a side of the second light-emitting control transistor T7 away from the switching transistor T3. The position of the storage capacitor Cst is the same as that of the driving transistor T4.

With the above provision manner, the transistors and the storage capacitors in the pixel circuit 21 may be closely arranged, and thus the areas of the display panel 100 in the first direction X and the second direction Y may be saved, so that more pixel circuits 21 may be arranged in a certain area. As a result, the pixel density of the display panel 100 and the display apparatus 1000 may increase, which is beneficial to the design of high pixels per inch (PPI) of the display panel 100 and the display apparatus 1000.

Figure 30:
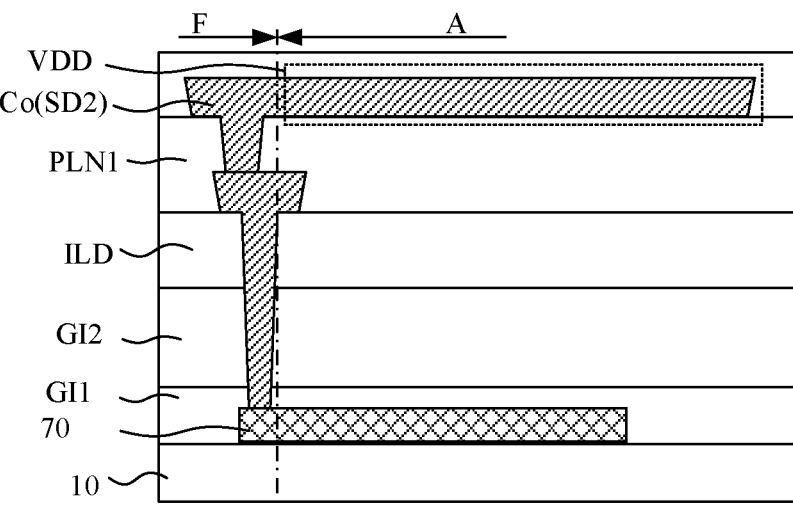
FIG. 30 is a cross-sectional view of a connection of a light-shielding layer and a first voltage signal line, in accordance with some embodiments of the present disclosure.

In some embodiments, as shown in FIG. 30, the display panel 100 further includes a first voltage signal line VDD and a transfer layer Co that are disposed in the pixel circuit layer 20.

For example, the first voltage signal line VDD is located in the fourth conductive layer SD2.

For example, the transfer layer Co may be disposed in the same layer as the fourth conductive layer SD2.

For example, the transfer layer Co may include transfer patterns.

For example, the light-shielding layer 70 is connected to the first voltage signal line VDD through a transfer pattern.

For example, the transfer pattern may sequentially pass through the via holes in the first planarization layer PLN1, the interlayer dielectric layer ILD, the second insulating layer GI2, and the first insulating layer GI1 to be connected to the light-shielding layer 70.

For example, the transfer pattern may be located in the frame region F, and thus the transfer pattern may be connected to the light-shielding layer 70 in the frame region F.

In some examples, the material of the light-shielding layer 70 includes molybdenum or graphite.

With the above provision manner, the material of the light-shielding layer 70 may conduct electricity. In a case where the light-shielding layer 70 is connected to the first voltage signal line VDD, since the signal transmitted by the first voltage signal line VDD is a constant voltage signal, there is a constant voltage signal on the light-shielding layer 70, thereby ensuring the stability of the voltage signal on the pixel circuit layer 20 (e.g., a scanning signal line) on the light-shielding layer 70, prevent the signal on the pixel circuit layer from being interfered, and improve the stability of the signal transmitted by the pixel circuit layer 20.

In some other examples, the light-shielding layer 70 may alternatively be coupled to another signal line for transmitting a constant voltage signal, such as the common voltage line VSS, the first initial signal line Vinit1, the second initial signal line Vinit2, or the like, thereby ensuring the stability of the voltage signal on the pixel circuit layer 20 (e.g., a scanning signal line) on the light-shielding layer 70, prevent the signal on the pixel circuit layer from being interfered, and improve the stability of the signal transmitted by the pixel circuit layer 20.

The foregoing descriptions are merely specific implementation manners of the present disclosure, but the protection scope of the present disclosure is not limited thereto, any changes or replacements that a person skilled in the art could conceive of within the 10 technical scope of the present disclosure shall be included in the protection scope of the present disclosure. Therefore, the protection scope of the present disclosure shall be subject to the protection scope of the claims.

What is claimed is:

1. A display panel having a display region, the display region including a main display region and a secondary display region, and the main display region surrounding at least part of the secondary display region;

the display panel comprising:

a base substrate at least located in the display region;

a pixel circuit layer located on a side of the base substrate and at least located in the display region, the pixel circuit layer including a plurality of surrounding pixel circuits, the plurality of surrounding pixel circuits being located in the main display region and at least partially surrounding the secondary display region; and a light-shielding layer located in the main display region and between the base substrate and the pixel circuit layer, an orthographic projection of the light-shielding layer on the base substrate at least partially overlapping with an orthographic projection of the plurality of surrounding pixel circuits on the base substrate;

wherein the light-shielding layer includes a plurality of light-shielding patterns;

an orthographic projection of at least part of a surrounding pixel circuit on the base substrate is located within an orthographic projection of a light-shielding pattern on the base substrate;

the plurality of surrounding pixel circuits are arranged in a plurality of columns in a first direction and in a plurality of rows in a second direction; and in some surrounding pixel circuits located on a same side of the secondary display region, light-shielding patterns corresponding to at least two surrounding pixel circuits adjacent in the first direction are not connected, or light-shielding patterns corresponding to at least two surrounding pixel circuits adjacent in the second direction are not connected.

2. The display panel according to claim 1, wherein the surrounding pixel circuit includes a driving transistor; and an orthographic projection of an active layer of the driving transistor on the base substrate is located within the orthographic projection of the light-shielding pattern on the base substrate.

3. The display panel according to claim 2, wherein the surrounding pixel circuit further includes a compensation transistor coupled to the driving transistor; and an orthographic projection of an active layer of the compensation transistor on the base substrate is located within the orthographic projection of the light-shielding pattern on the base substrate.

4. The display panel according to claim 1, wherein in a case where the light-shielding patterns corresponding to the at least two surrounding pixel circuits adjacent in the second direction are not connected, light-shielding patterns corresponding to at least two surrounding pixel circuits adjacent in the first direction are connected; or in a case where the light-shielding patterns corresponding to the at least two surrounding pixel circuits adjacent in the first direction are not connected, light-shielding patterns corresponding to at least two surrounding pixel circuits adjacent in the second direction are connected.

5. The display panel according to claim 1, wherein the light-shielding layer further includes at least one connection pattern; and two adjacent light-shielding patterns are connected to each other through a connection pattern.

6. The display panel according to claim 1, further comprising a first voltage signal line and a transfer layer that are disposed in the pixel circuit layer, wherein the light-shielding layer is connected to the first voltage signal line through the transfer layer.

7. The display panel according to claim 1, wherein a material of the light-shielding layer includes molybdenum or graphite.

8. The display panel according to claim 1, wherein the plurality of surrounding pixel circuits are arranged in a plurality of columns in a first direction and in a plurality of rows in a second direction;

in the first direction, at least six columns of surrounding pixel circuits are disposed on any side in opposite sides of the secondary display region; and in the second direction, at least three rows of surrounding pixel circuits are disposed on any side in opposite sides of the secondary display region.

9. The display panel according to claim 1, wherein the pixel circuit layer further includes a plurality of redundant pixel circuits;

the plurality of redundant pixel circuits are located in the main display region and surround at least part of the secondary display region; and the plurality of redundant pixel circuits are closer to the secondary display region than the plurality of surrounding pixel circuits.

10. The display panel according to claim 9, wherein the plurality of surrounding pixel circuits are arranged in a plurality of columns in a first direction and in a plurality of rows in a second direction; and the plurality of redundant pixel circuits are arranged in at least one column in the first direction and in at least one row in the second direction;

in the first direction, a sum of a number of columns of surrounding pixel circuits and a number of columns of redundant pixel circuits disposed on any side in opposite sides of the secondary display region is greater than or equal to 6; and in the second direction, a sum of a number of rows of surrounding pixel circuits and a number of rows of redundant pixel circuits disposed on any side in opposite sides of the secondary display region is greater than or equal to 3.

11. The display panel according to claim 1, further comprising a plurality of first light-emitting devices disposed in the main display region;

the pixel circuit layer includes a plurality of first pixel circuits located in the main display region, and the plurality of first pixel circuits are coupled to the plurality of first light-emitting devices; and at least some surrounding pixel circuits in the plurality of surrounding pixel circuits are first pixel circuits.

12. The display panel according to claim 1, further comprising a plurality of second light-emitting devices disposed in the secondary display region;

the pixel circuit layer includes a plurality of second pixel circuits located in the main display region, and the plurality of second pixel circuits are coupled to the plurality of second light-emitting devices through conductive lines; and at least some surrounding pixel circuits in the plurality of surrounding pixel circuits are second pixel circuits.

13. The display panel according to claim 1, further comprising a plurality of second light-emitting devices disposed in the secondary display region;

the pixel circuit layer includes a plurality of second pixel circuits located in the secondary display region, and the plurality of second pixel circuits are coupled to the plurality of second light-emitting devices.

14. The display panel according to claim 1, further comprising a plurality of second light-emitting devices disposed in the secondary display region; wherein the display panel further has a frame region located on at least one side of the display region;

the pixel circuit layer includes a plurality of second pixel circuits located in the frame region, and the plurality of second pixel circuits are coupled to the plurality of second light-emitting devices through conductive lines.

15. A display apparatus, comprising the display panel according to claim 1.

16. The display apparatus according to claim 15, further comprising:

an optical element located on a side of the light-shielding layer away from the pixel circuit layer;

and an orthographic projection of the optical element on the base substrate being located in the secondary display region.

\* \* \* \* \*